United States Patent [19]
Nishi et al.

[11] Patent Number: 5,591,958
[45] Date of Patent: Jan. 7, 1997

[54] SCANNING EXPOSURE METHOD AND APPARATUS

[75] Inventors: Kenji Nishi, Yokohama; Shinji Wakamoto, Tokyo, both of Japan

[73] Assignee: Nikon Corporation, Tokyo, Japan

[21] Appl. No.: 622,920

[22] Filed: Mar. 27, 1996

Related U.S. Application Data

[63] Continuation of Ser. No. 260,398, Jun. 14, 1994, abandoned.

[30] Foreign Application Priority Data

Jun. 14, 1993 [JP] Japan .................................. 5-141912
Jun. 16, 1993 [JP] Japan .................................. 5-144633

[51] Int. Cl.$^6$ .............................. G01J 1/20; G01J 1/32
[52] U.S. Cl. ...................... 250/205; 250/201.1; 356/400; 355/71
[58] Field of Search ........................ 355/53, 69, 71; 250/201.2, 548, 555, 205; 356/400, 401

[56] References Cited

U.S. PATENT DOCUMENTS

| | | | |
|---|---|---|---|
| 4,465,368 | 8/1984 | Matsuura et al. | 356/218 |
| 4,677,301 | 6/1987 | Tanimoto et al. | 250/548 |
| 4,712,910 | 12/1987 | Sakato | 355/53 |
| 4,747,678 | 5/1988 | Shafer et al. | 350/505 |
| 4,853,745 | 8/1989 | Kamiya et al. | 355/43 |
| 4,884,101 | 11/1989 | Tanimoto | 355/68 |
| 4,924,257 | 5/1990 | Jain | 355/53 |
| 4,962,318 | 10/1990 | Nishi | 250/548 |
| 4,970,546 | 11/1990 | Suzuki et al. | 355/53 |
| 5,097,291 | 3/1992 | Suzuki | 355/69 |
| 5,117,255 | 5/1992 | Shiraishi et al. | 355/53 |
| 5,191,374 | 3/1993 | Hazama et al. | 355/43 |
| 5,194,893 | 3/1993 | Nishi | 355/53 |

OTHER PUBLICATIONS

Shiraishi et al, "New Imaging Technique for 64M–DRAM," *SPIE Optical/Laser Microlithography V*, vol. 1674 (1992), pp. 741–752.
Chen, et al., "Submicrometer Lithography Using Lensless High–Efficiency Holographic Systems," *Optics Letters*, vol. 15, No. 15, 1990 Optical Society of America, pp. 369–371.
Clube, et al., "Holographic Mask Aligner," *Optical Engineering*, vol. 32, No. 10, Oct. 1993, pp. 2403–2409.
Levenson, "Wavefront Engineering for Photolithography," *Physics Today*, Jul. 1993, pp. 28–36.

*Primary Examiner*—Georgia Y. Epps
*Assistant Examiner*—Jacqueline M. Steady
*Attorney, Agent, or Firm*—Shapiro and Shapiro

[57] ABSTRACT

An exposure apparatus for transferring a pattern formed on a mask to a photosensitive substrate is provided with an illumination optical system for illuminating a local area on the mask with a light beam, a projection optical system for projecting the pattern of the mask to the photosensitive substrate and a relative scanning device for relatively scanning the mask and the photosensitive substrate in a perpendicular direction to the optical axis of the projection optical system so as to transfer the pattern of the mask to the photosensitive substrate. The apparatus further has an adjusting device for adjusting at least one of the scanning speeds of the mask and substrate, the intensity of the light beam to be incident on the photosensitive substrate and the width of a projection area of the pattern of the mask by the projection optical system in the relative scanning direction in accordance with the change of the sensitivity characteristic of the photosensitive substrate or the change of the intensity distribution of the light beam passing a Fourier transform plane in the illumination optical system with respect to the pattern surface of the mask.

22 Claims, 11 Drawing Sheets

SCANNING EXPOSURE METHOD AND APPARATUS

This is a continuation of application Serial No. 08/260,398 filed Jun. 14, 1994, now abandoned.

BACKGROUND OF THE INVENTION

1. Field of the Invention

The present invention relates to an exposure apparatus to be used in a photolithography process for manufacturing a semiconductor device, a liquid crystal display device, a thin film magnetic head, etc. and more particularly to a scanning type exposure apparatus for exposing a pattern of a mask (or reticle) to a photosensitive substrate by shifting the mask and the photosensitive substrate synchronously.

2. Related Background Art

In a photolithography process for manufacturing a semiconductor device, a projection exposure apparatus is used wherein the pattern of a photomask or a reticle (hereinafter referred to the reticle) is transferred via a projection optical system to a semiconductor wafer (or a glass plate, etc.) coated with a photosensitive material (photoresist). Presently, reduction projection type exposure apparatuses (steppers) of a step-and-repeat system disclosed in e.g., U.S. Pat. Nos. 4,677,301 and 4,962,318 have been widely used. As illumination for exposure, emission lines (i-line and the like) from a mercury lamp, a KrF or ArF excimer laser or a higher harmonic such as of a metal vapor laser or a YAG laser is used.

In projection exposure apparatuses as disclosed in e.g., U.S. Pat. Nos. 4,712,910 and 4,884,101, a shutter is utilized to open and close the path of light from a light source thereby to control the amount of exposure. That is, the amount of exposure imparted to a wafer is controlled to an optimum value corresponding to the sensitivity of the photoresist of the wafer. Especially in projection type exposure apparatuses with pulsed laser light sources such as of an excimer laser or the like, as disclosed in, e.g., U.S. Pat. Nos. 4,970,546, 5,097,291 and 5,191,374, an amount of energy per pulse is set to a predetermined value thereby to control the amount of exposure.

Recently, as semiconductors become large in size and minute in structure, it is required to enlarge the image field of the projection optical system and to improve the resolution thereof. However, it is extremely difficult to obtain both the high resolution and the large image field in the projection optical system from the viewpoint of design and manufacture. Therefore, as disclosed in, e.g., U.S. Pat. Nos. 4,747,678, 4,924,257 and 5,194,893, scanning type projection exposure apparatuses are paid attention in which only a local area of a reticle is illuminated and the reticle and a wafer are shifted synchronously to expose the pattern of the reticle to the wafer. In such scanning type exposure apparatuses, even though the image field of a projection optical system is small, it is possible to expose a pattern with a large area to the wafer and to improve the resolution of the projection optical system comparatively easily.

However, if the conventional exposure control method is applied to such scanning type exposure apparatuses, the amount of exposure to the wafer cannot be controlled to an optimum value corresponding to the sensitivity of the photoresist. That is, in a scanning type exposure apparatus with a light source emitting continuous light such as of i-lines, even though only a time for opening a shutter is controlled as in U.S. Pat. No. 4,712,910, an optimum amount of exposure cannot be imparted to the wafer. Also, when the sensitivity of the photoresist is changed, the amount of exposure cannot be controlled properly in accordance with the change. Further, in a scanning type exposure apparatus with a light source emitting a light beam such as an excimer laser, etc., there is a chance that the number of light beams illuminating a wafer is different in various positions on the wafer in accordance with the relationship between the rate of movement of the wafer and the timing of emissions of light beams. Namely, there is a change that unevenness of the amount of light occurs.

SUMMARY OF THE INVENTION

It is therefore a first object of the present invention to provide a scanning type exposure apparatus in which even though the pattern of a reticle is scanned and exposed to a photosensitive substrate by the use of a light source for emitting continuous light, an optimum amount of exposure can be imparted to the photosensitive substrate in accordance with the sensitivity thereof without lowering the throughput and incurring unevenness of illuminance.

It is a second object of the present invention to provide a scanning type exposure apparatus in which even though the pattern of a reticle is scanned and exposed to a photosensitive substrate by use of a light source for emitting laser lights, an optimum amount of exposure can be imparted to the photosensitive substrate without causing unevenness of the quantity of light.

Therefore, in order to achieve the first object, a first apparatus of the present invention has a light source for emitting continuous light, an illumination optical system for illuminating a local area on a mask with light from the light source and a projection optical system for projecting the image of the pattern of the mask within the local area to a photosensitive substrate with a photosensitive material applied thereon and, the pattern of the mask is scanned and exposed on the sensitive substrate by synchronously shifting the mask and the photosensitive substrate in a predetermined scanning direction perpendicular to an optical axis of the projection optical system. The first apparatus further has an adjusting device for adjusting the intensity of the light to be incident on the substrate and a control device for controlling the adjusting device in accordance with the sensitivity characteristic of the photosensitive material, the speed of the substrate and the width of a projection area of the pattern of the mask by the projection optical system in the scanning direction. Therefore, even though the sensitivity characteristic of the photosensitive material is changed, the intensity of the light is changed accordingly, so that an optimum amount of exposure can be imparted to the substrate. In particular, when the photosensitive material has a low sensitivity, the intensity of the light is increased, so that the speed of the substrate can be maintained to an upper limit (the maximum speed of the substrate stage). Therefore, the lowering of the throughput can be prevented. On the other hand, when the photosensitive material has a high sensitivity, even though the speed of the substrate reaches the upper limit (the maximum speed of the substrate stage), the intensity of the light is decreased, so that an optimum amount of exposure can be imparted to the substrate.

Also, in order to achieve the first object of the present invention, a second apparatus has a light source for emitting continuous light, an illumination optical system for illuminating a local area on a mask with the light from the light source and a projection optical system for projecting the image of a pattern on the mask within the local area to a substrate with a photosensitive material applied thereto. And, the image of the pattern of the mask is scanned and exposed on the substrate by synchronously shifting the mask and the substrate in a predetermined scanning direction perpendicular to the optical axis of the projection optical system. The second apparatus further has an optical member for varying the width of the local area on the mask in the scanning direction and a control device for controlling the optical member in accordance with the intensity of the light to be incident on the substrate, the sensitivity characteristic of the photosensitive material and the speed of the substrate. Therefore, even though the sensitivity characteristic is changed, an optimum amount of exposure can be imparted to the substrate, as the width of the projection area of the pattern of the mask by the projection optical system in the scanning direction is changed. In particular, when the photosensitive material has a low sensitivity, the width of the local illumination area on the mask in the scanning direction is enlarged, so that the speed of the substrate can be maintained to an upper limit (the maximum speed of the substrate stage). Therefore, the lowering of the throughput can be prevented. On the other hand, when the photosensitive material has a high sensitivity, even though the speed of the substrate reaches an upper limit (the maximum speed of the substrate stage), the width of the local illumination area is narrowed, so that an optimum amount of exposure can be imparted to the substrate.

Further, the second apparatus may be provided with a detecting device for detecting the intensity of light to be incident on the substrate and the control device may control the adjusting device in accordance with the output of the detecting device. In this case, even though the intensity (illuminance) of the light is changed with the passage of time, the width of the local illumination area in the scanning direction can be changed in accordance with the change of the intensity, whereby an optimum amount of exposure can be imparted to the substrate.

In the apparatuses of the present invention for achieving the first object, if the magnification of the projection optical system is $\beta$ (e.g., $\beta=\frac{1}{5}$, or $\frac{1}{4}$), the width of the local illumination area on the mask in the scanning direction is $L_R$, and the width of the projection area (the similar area with respect to the local illumination area) of the pattern of the mask by the projection optical system in the scanning direction is $L_W$, the widths $L_R$ and $L_W$ are in the following relation:

$$L_R = (1/\beta) \cdot L_W \tag{1}$$

If the scanning speed of the substrate is $V_w$, the scanning speed of the mask is $V_R$, the speeds $V_R$ and $V_W$ are in the following relation:

$$V_R = (1/\beta) \cdot V_W \tag{2}$$

When utilizing the light source for emitting continuous light, if the illuminance of the light on the substrate is Q, and the sensitivity (corresponding to the optimum amount of exposure) of the photosensitive material on the substrate is P, the exposure time t necessary for obtaining an optimum amount of exposure at a point is expressed as:

$$t = P/Q \tag{3}$$

From the equations (1) and (2), the exposure time t' at a point on the substrate when the substrate is shifted at the speed $V_W$ with respect to the projection area of the mask pattern having the width $L_W$ is expressed as:

$$t' = L_W/V_W \tag{4}$$

Therefore, in order to make the exposure time t of the equation (3) equal to the exposure time t' of the equation (4), the following equation needs to hold:

$$P/Q = L_W/V_W, \text{ i.e., } P \cdot V_W = L_W \cdot Q \tag{5}$$

That is, in order to impart an optimum amount of exposure to the substrate in accordance to the sensitivity P of the photosensitive material, it is necessary to determine the width $L_W$ of the projection area, the illuminance Q of the light on the substrate and the scanning speed of the substrate $V_W$ in accordance with the sensitivity P so as to satisfy the equation (5). Then, in the present invention, while aiming at the equation (5), at least one of the width $L_W$, the illuminance Q and the speed $V_w$ is made variable to impart an optimum amount of exposure to the substrate in accordance with the sensitivity P of the photosensitive material. Therefore, even though the sensitivity P of the photosensitive material is changed, an optimum amount of exposure can be imparted to the substrate.

When the equation (2) is substituted into the equation (5), the scanning speed $V_R$ of the mask is expressed as:

$$V_R = L_W \cdot Q/(\beta \cdot P) \tag{6}$$

Accordingly, when the width $L_W$ of the projection area, the illuminance Q and the magnification $\beta$ are constant, the scanning speed of the mask is changed reasonably in accordance with the sensitivity P of the photosensitive material. Generally, in scanning type exposure apparatuses for manufacturing semiconductors, the projection optical system is the reduction type. That is, the magnification of the projection optical system $\beta$ is less than 1. Therefore, as is apparent from the equation (2), the scanning speed $V_W$ of the substrate is faster than the scanning speed $V_R$. Then, when the upper limit $V_{Rmax}$ (maximum speed of the mask stage) of the scanning speed of the mask is less than $1/\beta$ times the upper limit $V_{Wmax}$ (maximum speed of the substrate stage) of the scanning speed of the substrate, i.e., $V_{Rmax} < V_{Wmax}$ holds, the mask rather than the substrate easily reaches the upper limit. Accordingly, as the scanning speed $V_R$ of the mask needs to be set to equal to or less than the upper limit $V_{Rmax}$ inevitably, the following relation holds from the equation (6). When the following equation (7) holds, the scanning speed $V_W$ of the substrate will not exceed the upper limit $V_{Wmax}$.

$$V_R = L_W \cdot Q/(\beta \cdot P) \leq V_{Rmax} \tag{7}$$

In order to impart an optimum amount of exposure to the substrate in accordance with the sensitivity P of the photosensitive material in consideration of the upper limit $V_{Rmax}$ of the scanning speed of the mask, it is necessary to determine the width $L_W$ of the projection area, the illuminance Q of the light on the substrate and the scanning speed $V_w$ of the substrate.

In conventional scanning exposure apparatuses, only the scanning speeds $V_W$ and $V_R$ of the substrate and mask are made variable. Therefore, depending on the type of photosensitive material, there is a case that the scanning speed $V_W$ of the substrate determined from the equation (5) in accordance with its sensitivity does not satisfy the equation (7). Especially, when utilizing a photosensitive material with a high sensitivity (the value of the sensitivity P is small), the value of the left side of the expression (7) becomes large and the scanning speed $V_R$ of the mask might exceed the upper limit $V_{Rmax}$.

Then, in the present invention, according to the upper limit $V_{Rmax}$, at least one of the width $L_W$ of the projection area and the illuminance Q is made variable and the scanning speed $V_W$ of the substrate and at least one of the width $L_W$ are determined in accordance with the sensitivity P of the photosensitive material so as to satisfy the expressions (5) and (7). For example, in a photosensitive material with a high sensitivity, the width $L_W$ of the projection area of the mask pattern (i.e., the width of the local illumination area on the mask) is narrowed, or the illuminance Q of the light on the substrate is decreased. Therefore, even in such a highly sensitive photosensitive material, the scanning speed $V_R$ of the mask will not exceed the upper limit $V_{Rmax}$ and an optimum amount of exposure can be imparted to the substrate. At this time, when the scanning speed $V_R$ of the mask is set to the upper limit $V_{Rmax}$ and the scanning speed $V_W$ is set to $\beta \cdot V_{Rmax}$, the throughput becomes preferable while an optimum amount of exposure is imparted to the substrate.

On the other hand, when utilizing a photosensitive material having a low sensitivity (the value of the sensitivity P is large), the value of the left side of the expression (7) becomes small. Therefore, even though only the scanning speeds $V_W$, $V_R$ of the substrate and mask are made variable, the scanning speed $V_R$ becomes slow but will not exceed the upper limit $V_{Rmax}$ and an optimum amount of exposure can be imparted to the substrate. However, the decrease of the scanning speed of the mask (substrate) leads to lowering of the throughput. Therefore, even when the photosensitive material with the low sensitivity is utilized, it is desirable to make one of the width $L_W$ of the projection area and the illuminance Q variable. That is, in the photosensitive material with the low sensitivity, while the scanning speed $V_R$ of the mask is maintained to the upper limit $V_{Rmax}$, at least one of the width $L_W$ and the illuminance Q should be determined in accordance with the sensitivity P so as to satisfy the expressions (5) and (7). At this time, the width $L_W$ of the projection area of the mask pattern is widened or the illuminance Q of the light on the substrate is increased. Accordingly, even in the photosensitive material with the low sensitivity, an optimum amount of exposure can be imparted to the substrate while the lowering of the throughput is prevented.

The above description is directed to the case in which $V_{Rmax} < V_{Wmax}/\beta$ holds, but when $V_{Rmax} \geq V_{Wmax}/\beta$ holds, the width $L_W$ of the projection area, the illuminance Q and the scanning speed $V_W$ of the substrate should be determined so as to satisfy both the expression (5) and the following expression (8):

$$V_W = L_W \cdot Q/P \leq V_{Wmax} \qquad (8)$$

When the expression (8) holds, the scanning speed $V_R$ of the mask never exceeds the upper limit $V_{Rmax}$. Also, even though all three conditions of the width $L_W$, the illuminance Q and the speed $V_W$ are not made variable, it is sufficient to determine one or two variable conditions to satisfy the expressions (5) and (8) such that the scanning speed $V_W$ of the substrate will not exceed the upper limit $V_{Wmax}$ and the throughput is not lowered.

Also, in order to achieve the second object of the present invention, a third apparatus of the present invention has a light source for emitting a light beam, an illumination optical system for illuminating a local area on a mask with the pulsed light from the light source and a projection optical system for projecting the image of the pattern of the mask within the local area to a substrate with a photosensitive material applied thereto. The image of the pattern of the mask is scanned and exposed on the substrate by synchronously shifting the mask and the substrate in a predetermined scanning direction perpendicular to the optical axis of the projection optical system. In this embodiment, the width of the projection area of the pattern of the mask by the projection optical system (a similar area with respect to the local illumination area on the wafer) in the scanning direction is set to an integer multiple of the distance by which the substrate is shifted relatively with respect to the projection area of the pattern of the mask for a period of the light emission of the light source.

As above, in this apparatus, e.g., in FIG. 13A, the width $\beta \cdot L$ of the projection area (246P) of the pattern of the mask on the substrate (215) by the projection optical system is n times the distance $\Delta L$ by which the substrate is shifted for the period of the light emission of the light source in the DW direction. That is, the following equation hold:

$$\beta \cdot L = n \cdot \Delta L.$$

In this case, a position on the substrate on which an edge of the projection area (246P) is located when a light emission from the light source is done is a point P1 and the energy imparted to each positions on the substrate for a light emission is assumed to be $\Delta E$. Then, an energy of $\Delta E/2$ is imparted to the point P1 on the edge of the projection area (246P) at the time of a light emission. Therefore, the total energy of $E_{P1}$ is imparted to the point P1 is as follows:

$$E_{P1} = 2 \times \Delta E/2 + (n-1) \times \Delta E = n \times \Delta E.$$

Also, with respect to a point P2 located slightly inside the edge of the projection area (246P), n light emissions are carried out while the point P2 is located within the projection area (246P). Namely, an energy of $n \times \Delta E$ is imparted to the point P2. As a result, the energy of $n \times \Delta E$ is imparted to each position on the substrate, so that unevenness of the illuminance does not occur.

On the other hand, in FIG. 13B, the width of the projection area (246P) of the pattern of the mask on the substrate in the DW direction is $\beta \cdot L1$ and 3.5 times the distance $\Delta L$ by which the substrate is shifted in the DW direction for the period of the light emission of the light source. In this case, when the position on the substrate on which an edge of the projection area (246P) is located is Q1, an amount of energy imparted to the point Q1 is $3.5 \times \Delta E$. Also, an amount $E_{Q2}$ of energy imparted to a point Q2 located slightly inside the edge of the projection area (246P) is $4 \times \Delta E$ while an amount $E_{Q3}$ of energy imparted to a point Q3 located slightly outside the projection area is $3 \times \Delta E$. Therefore, the amount of energy imparted to each position on the substrate is varied within the range of $3 \times \Delta E$ to $4 \times \Delta E$, thereby causing unevenness of the illuminance.

DETAILED DESCRIPTION OF THE PREFERRED EMBODIMENTS

Figure 1:
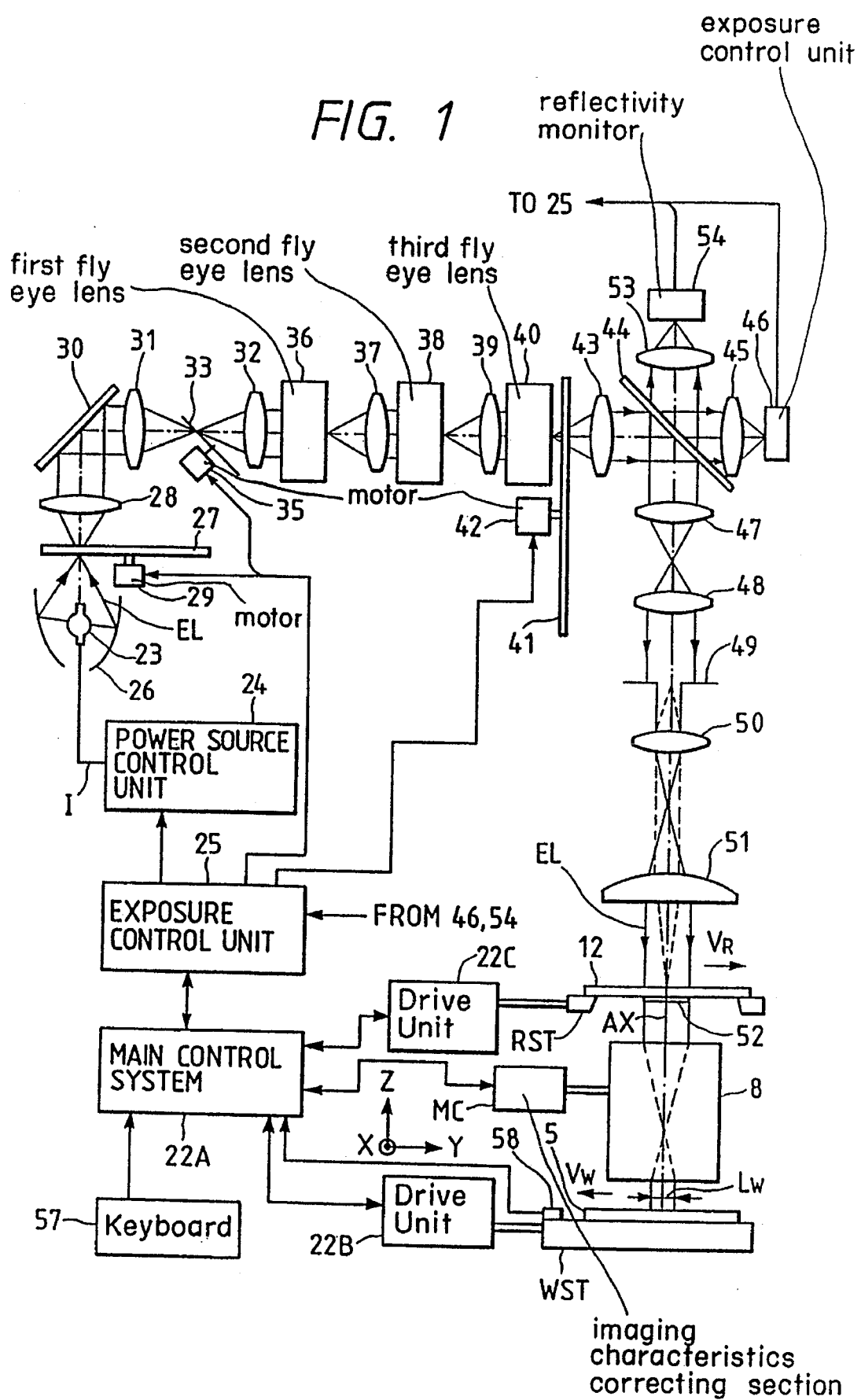
FIG. 1 shows the whole structure of a scanning type projection exposure apparatus according to a first embodiment of the present invention.

A first embodiment of the present invention will be described with reference to FIGS. 1 to 4A and 4B. In this embodiment, the present invention is applied to a scanning type projection exposure apparatus with a light source for emitting continuous light. FIG. 1 shows the whole structure of the scan and projection type exposure apparatus of this embodiment and FIG. 2 shows the structure of the stage system in FIG. 1.

Figure 2:
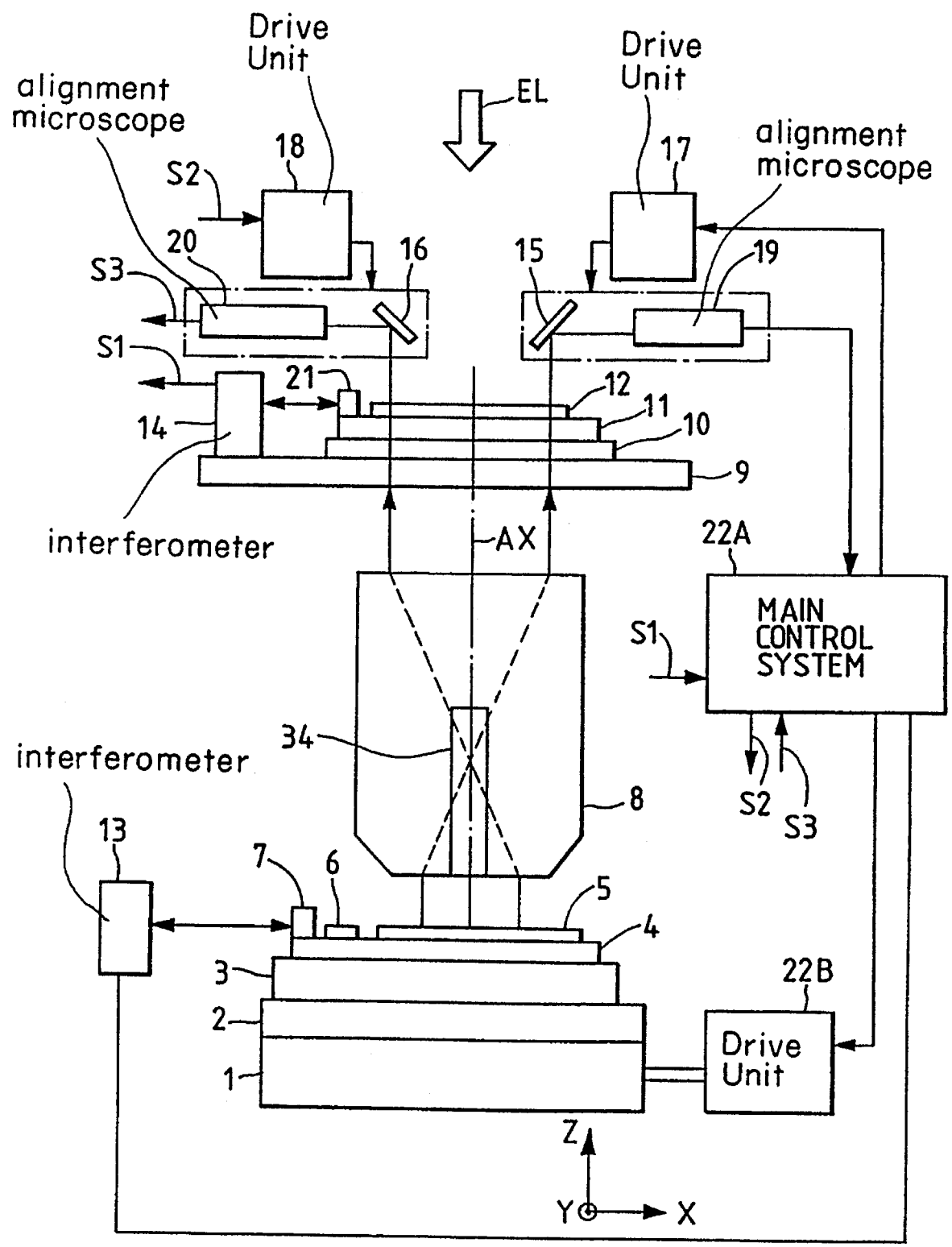
FIG. 2 shows the structure of the stage system of the apparatus in FIG. 1.

In FIG. 2, light EL from an illumination optical system illuminates only a local illumination area (e.g., a rectangular area elongated in the X direction) on a reticle 12. The light EL transmitted through the reticle 12 enters a projection optical system 8 which is telecentric on both sides. The projection optical system 8 projects a part of the image of the pattern on the reticle 12 within the illumination area on a wafer 5 with a photoresist applied thereon. In the apparatus of FIG. 2, if the magnification of the projection optical system 8 is $\beta$, the reticle 12 is shifted in the Y direction (direction perpendicular to the paper) perpendicular to the optical axis AX of the projection optical system 8 at a constant speed $V_R$ while the wafer 5 is shifted in the Y direction at a constant speed $V_W$ ($=\beta \cdot V_R$) in synchronism with the movement of the reticle 12. Thereby, the light EL illuminates the whole surface of the pattern of the reticle 12 and the image of the pattern is scanned and exposed on the wafer 5. In this embodiment, as the projection optical system 8 is constituted of only a plurality of refracting elements, the reticle 12 and the wafer 5 are shifted each other in the opposite directions along the Y direction.

A roughly shiftable stage 10 is disposed on a base 9 and a minutely shiftable stage 11 is disposed on the roughly shiftable stage 10. The reticle 12 is supported on the minutely shiftable stage 11 by a vacuum chuck or the like. The roughly shiftable stage 10 can be shifted only in the Y direction and is driven so as to shift the reticle 12 at the constant speed in the Y direction when scanning the image of the pattern of the reticle 12 and exposing it on the wafer 12. The minutely shiftable stage 11 can be shifted slightly in a plane perpendicular to the optical axis AX of the projection optical system 8, i.e., can be shifted slightly in the X and Y directions and the direction of rotation ($\theta$ direction). It is possible to position the reticle 12 precisely by the minutely shiftable stage 11. The roughly shiftable stage 10 and the minutely shiftable stage 11 are driven by a drive unit 22C (see FIG. 1) independently of each other. A movable mirror 21 is disposed on the minutely shiftable stage 11 to reflect a laser beam from an interferometer 14 on the base 9. The interferometer 14 constantly detects the position of the minutely shiftable stage 11 in the X and Y directions and the deviation (amount of rotation) thereof in the $\theta$ direction. The position information S1 from the interferometer 14 is supplied to a main control system 22A.

In the meantime, a Y stage 2 shiftable in the Y direction is disposed on a base 1 and an X stage 3 shiftable in the X direction is disposed on the Y stage 3. On the X stage 3 is further disposed a Z stage 4 slightly shiftable in the Z direction. The wafer 5 is supported by the Z stage via a slightly rotatable wafer holder ($\theta$ table). The X, Y and Z states 2 to 4 are driven by a drive unit 22B independently of each other. A movable mirror 7 is mounted on the Z stage 4. An interferometer 13 constantly detects the position of the Z stage 4 in the X and Y directions and the deviation (amount of rotation) thereof in the $\theta$ direction. The position information from the interferometer 13 is supplied to the main control system 22A. The main control system 22A determines the positions of the wafer 5 and the reticle 12 via the drive units 22B and 22C and controls the movements thereof at the time of the scanning exposure. In addition, the main control system 22A controls the operation of the whole apparatus.

A reference mark plate 6 is fixed on the Z stage 4 in the vicinity of the wafer 5 so as to make the rectangular coordinate system defined by the interferometer 13 correspond to the rectangular coordinate system defined by the interferometer 14. Various reference marks are provided on the reference mark plate 6. For these marks, there are, e.g., light transmitting type marks as disclosed in U.S. Pat. No. 4,853,745, which are illuminated from the back surface of the reference mark plate 6 with light having approximately the same wavelength as the light EL and being led under the reference mark plate 6.

In this embodiment (FIG. 2), above the reticle 12 are provided two sets of alignment microscopes 19 and 20 for detecting the reference marks on the reference mark plate 6 and marks on the reticle 12. The information detected by the alignment microscopes 19 and 20 is supplied to the main control system 22A. Mirrors 15 and 16 are disposed movably so as to lead lights from the marks on the reticle 12 to the alignment microscopes 19 and 20. Upon starting an exposure sequence, the mirrors 15 and 16 are withdrawn from the light path by drive units 17 and 18 so as not to shield the light EL in accordance with the instructions from the main control system 22A. Further, in FIG. 2, e.g., as disclosed in U.S. Pat. No. 4,962,318, an off-access type alignment unit 34 is provided independently of the projection optical system 8 to detect the alignment marks on the wafer 5.

Next, the structures of the illumination optical system and the control system of the projection exposure apparatus of this embodiment will be described.

In FIG. 1, when a predetermined voltage is applied by a power source control unit 24, a mercury lamp 23 as the light source emits light. While a predetermined current is supplied, the mercury lamp 23 continues emitting light (e.g., i-lines with the wavelength of 365 nm) with constant brightness. In this embodiment, by changing the current I supplied from the power source control unit 24 to the mercury lamp 23 continuously within a predetermined range, the illuminance (intensity) of the light emitted from the mercury lamp 23 is changed continuously within a predetermined range. Also, an exposure control unit 25 which controls an amount of exposure for the wafer 5 to an optimum amount in accordance with the sensitivity of the photoresist controls the operation of the power source control unit 24.

The light from the mercury lamp 23 is condensed by an elliptical mirror 26. Thereafter, the light passes a rotatable light reducing filter plate 27, a lens 28, a mirror 30 and is condensed again by a lens 31 to form an image of the light source. At this position, a shutter 33 is disposed so as to open or close the light path.

Figure 3:
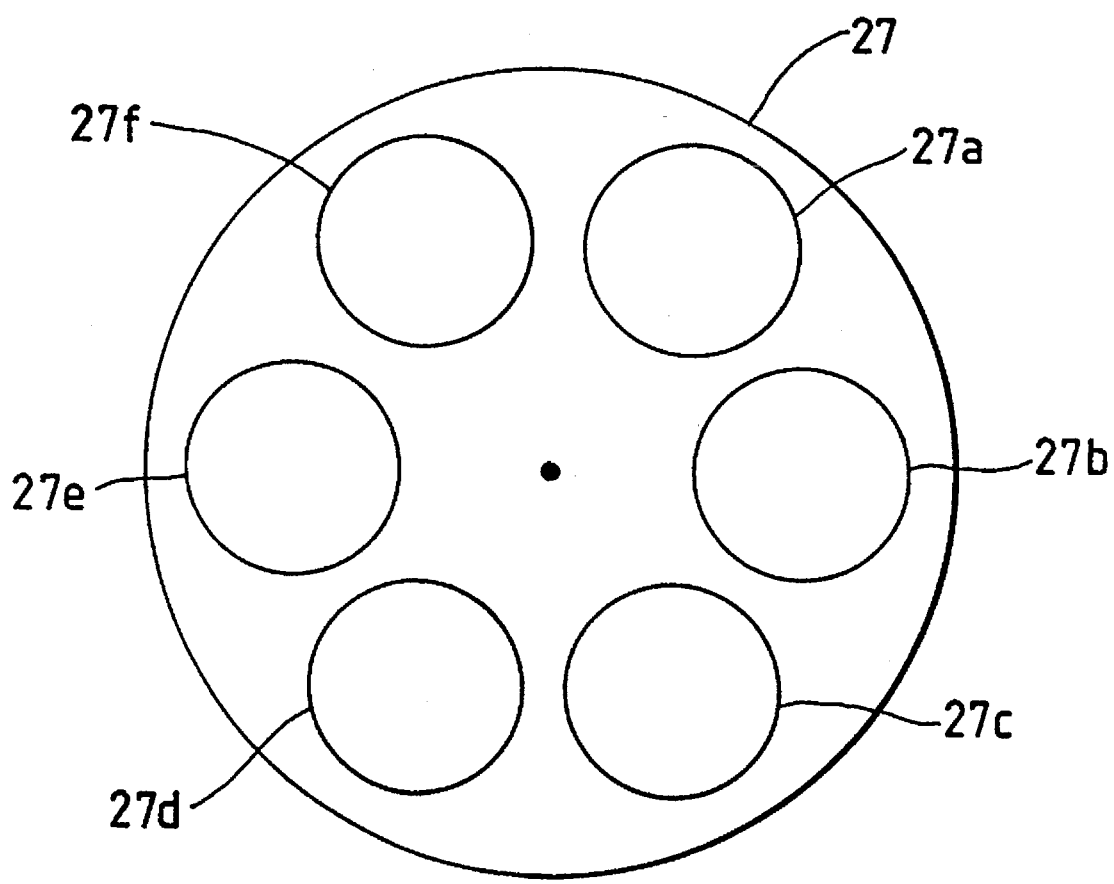
FIG. 3 shows the structure of a rotatable light reducing filter plate in FIG. 1.

The exposure control unit 25 sets the angle of rotation of the rotatable light reducing filter plate 27 via a motor 29. FIG. 3 shows the structure of the rotatable light reducing filter plate 27. In FIG. 3, the light reducing filter plate 27 is a circular disk formed with six circular openings at regular intervals. Light reducing filters 27a to 27f having different transmittances with respect to the light are fitted in the respective openings. For example, the transmittance of the light reducing filter 27a is 100% and the transmittances of the light reducing filters 27b to 27f are decreased in stages in that order. Therefore, the illuminance of the light can be varied in stages by adjusting the angle of rotation of the light reducing filter plate 27 and positioning one of the light reducing filters 27a to 27f in the light path.

Referring to FIG. 1 again, the exposure control unit 25 controls the operation of opening or closing the shutter 33 via a motor 35. When the shutter 33 is in the opened state, the light passing the shutter 33 becomes approximately a flux of parallel rays by means of a first input lens 32 and is incident on a first fly eye lens 36. A plane illuminant image (a plane in which a plurality of secondary light sources corresponding to respective elements of the first fly eye lens 36 are collected) is formed in the rear focal surface of the first fly eye lens 36. The light emanated from the first fly eye lens 36 becomes approximately a flux of parallel rays by means of a second input lens 37 and is incident on a second fly eye lens 38 to form a plurality of third light sources in the rear focal surface of the second fly eye lens 38. The light emanated from the second fly eye lens 38 becomes approximately a flux of parallel rays by means of a third input lens 39 and is incident on a third fly eye lens 40 to form a plurality of fourth light sources in the rear focal surface of the third fly eye lens 40.

The respective rear (the reticle side) focal surfaces of the first to third fly eye lenses 36, 38 and 40 coincide approximately with Fourier transform planes in the illumination optical system with respect to the pattern formed surface of the reticle 12. Also, the exit side plane (accurately the rear focal surface) of the first fly eye lens 36 and the incident side plane of the second fly eye lens 38 are in the Fourier transform form. Further, the exit side plane (the rear focal surface) of the second fly eye lens 38 and the incident side plane of the third fly eye lens are in the Fourier transform relation.

In the rear focal surface of the third fly eye lens 40, not only the surface illuminant image (the surface in which the plurality of fourth light sources are collected) is formed, but also a stop member 41 is disposed to define the shape and size of the surface illuminant image. The stop member 41 includes a turret plate (or a slider) formed with a plurality of aperture stops whose openings have different shapes and sizes. Therefore, in accordance with types of reticle patterns, it is possible to change the illuminance distribution of the light in the Fourier transform planes in the illumination optical system. In this embodiment, e.g., as introduced in "SPIE Optical/Laser Microlithography V"0 (Vol. 1674, Pub. 1992), the stop member 41 is provided with four openings having respective centers disposed at the equal distances from the optical axis, i.e., aperture stops for modified light source formed with respective cross-shaped light shielding portions (or light reducing portions), an annular opening, i.e., an aperture stop for annular illumination formed with a circular light shielding portion (or a light reducing portion), and an aperture stop (σstop) formed with a circular or a rectangular opening. The exposure control unit 25 positions a desirable aperture stop for the pattern on the reticle 12 in the vicinity of the exit plane of the third fly eye lens 40 by adjusting the angle of rotation of the stop member 41 via a motor 42.

The light emitted from the stop member 41 passes a lens 43 and is incident on a mirror 44 having the reflectivity of 99.5%. Most of the light is reflected by the mirror 44 to reach a field stop (reticle blind) 49 via a lens 47 and a first relay lens 48. The field stop 49 defines the illumination field of the light EL on the reticle 12 and has a rectangular opening elongated in the X direction. The light EL passing through the field stop 49 illuminates a local area on the reticle 12, i.e., only a rectangular illumination area 52 extending in the X direction with approximately uniform illuminance via a second relay lens 50 and a condenser lens 51. The projection optical system 8 projects a part of the pattern of the reticle 12, i.e., the image of the pattern within the illumination area 52 on the wafer 5.

Further, an imaging characteristics correcting section MC as disclosed in U.S. Pat. No. 5,117,255, is connected to the projection optical system 8. The imaging characteristics correcting section MC changes imaging characteristics of the projection optical system 8 such as the magnification thereof by slightly shifting at least one of a plurality of lens elements constituting the projection optical system 8.

The main control system 22A drives the reticle stage system RST (including the roughly shiftable stage 10 and the minutely shiftable stage 11 in FIG. 2) via the drive unit 22C to shift the reticle 12 at the speed $V_R$ in the Y direction (the rightward direction in the drawing). Also, in synchronism with the movement of the reticle 12, the main control system 22A drives the wafer stage system WST (including the X, Y and Z stages 2 to 4 in FIG. 2) via the drive unit 22B to shift the wafer 5 at the speed $V_W$ in the Y direction (the leftward direction in the drawing). Thereby, the image of the pattern on the reticle 12 is scanned and exposed on the wafer 5. Also, an operator inputs the sensitivity P of the photoresist on the wafer 5 from a keyboard 57 to the main control system 22A. The main control system 22A sends the input sensitivity P to the exposure control unit 25, which then controls the amount of exposure in accordance with the sensitivity P. On the wafer stage system WST is provided a photoelectric detecting device (light amount monitor) 58 for receiving a portion of the light EL, as disclosed in U.S. Pat. No. 4,465,368. A photoelectric signal from the light amount monitor 58 is sent to the main control system 22A. Further, when driving the wafer stage system WST such that the light amount monitor 58 traverses in the Y direction the area where the pattern of the reticle 12 is projected by means of the projection optical system 8, the main control system 12 can measure the width $L_W$ of the projection area in the Y direction by the photoelectric signal input from the light amount monitor 58 and the position information from the interferometer 13 (FIG. 2).

In the scan type exposure apparatus, the shutter 33 is fully opened immediately before the illumination area 52 enters the pattern area of the reticle 12 when the reticle 12 is shifted at the constant speed in the Y direction. Also, the shutter 33 is closed after the illumination area 52 is out of the pattern area of the reticle 12. Namely, the shutter 33 serves only to limit the width of a light shielding zone defining the pattern area on the reticle 12 small but is not used to control the amount of exposure. In this embodiment, the shutter 33 is used in performing a test exposure, checking the control system or the like. For example, when the pattern of the reticle 12 is exposed on the wafer 5 in the state with both the reticle 12 and the wafer 5 stationary, the amount of exposure is controlled by the opening and closing of the shutter 33.

In the meantime, a portion of the light transmitted through the mirror 44 is condensed on the light receiving surface of a photoelectric detecting device (integrator sensor) 44 by a condenser lens 45. Of most of the light reflected by the mirror 44, light reflected by the reticle 12 and light reflected by the wafer 5 return in the same light path, transmit the mirror 44 and reach a photoelectric detecting device (reflectivity monitor) 54 via a condenser lens 53. The output value of the refractivity monitor 54 obtained, provided that the reflected light from the wafer 5 will not return to the reflectivity monitor 54, corresponds to the intensity of the reflected light from the reticle 12. Therefore, when this output value is obtained in advance and when the obtained output value is subtracted from the value output from the refractivity monitor 54 in the state that the wafer 5 is positioned under the projection optical system 8, a value corresponding to the intensity of the reflected light from the wafer 5 is calculated. The output signals from the light amount monitor 58, the integrator sensor 46 and the reflectivity monitor 54 are supplied to the exposure control unit 25 via the main control system 22A and utilized to control the amount of exposure.

The operations of the sensors 46, 54 and 58 will be described in detail now. In the condition that the reticle 12 is not placed on the reticle stage system RST, the shutter 33 is opened to detect the light EL by means of the light amount monitor 55 and the integrator sensor 46. Then, the ratio of the amount of light on the wafer 5 (the output signal from the light amount monitor 58) to the amount of light received by the integrator sensor 46 is measured. Further, after the light amount monitor 58 is moved out of the image field of the projection optical system 8, a reference plate whose reflectivity is preliminarily known is placed in the image field to measure the ratio of the output signal from the integrator 46 to the output signal from the reflectivity monitor 54. By this method, the output signals of reflectivity monitor 54 and the integrator 46 are calibrated with respect to the output signal of the light amount monitor 58.

Next, after the reticle 12 is placed on the reticle stage system RST, the light amount monitor 58 is shifted in the image field of the projection optical system 8 and the scanning of the reticle 12 is started. The main control system 22A samples the output signal from the light amount monitor 58 during the scanning of the reticle 12, and calculates an integrated exposure amount after the end of the scanning. This operation is carried out because the energy reaching the wafer 5 is different for each pattern of reticles, so that it is necessary to correct changes of the magnification β and the focus position of the projection optical system 8 by actually monitoring the integrated exposure amount at the time of the scanning exposure.

When the output signal from the light amount monitor 58 is plotted along the time axis, a constant distribution is ascertained. This indicates the distribution of the pattern of the reticle 12. When that distribution is not uniform, the reticle 12 might be heat-distorted nonlinearly. This is because the distribution of the energy imparted to the reticle 12 has the same characteristic as the distribution of the pattern. Then, in this embodiment, based on the result of the detection (equivalent to the energy distribution), the scanning speed of the reticle stage system RST is minutely regulated during the scanning exposure to correct the heat-distortion of the reticle 12 in the scanning direction thereby to prevent the wafer 5 from being affected by the heat-distortion of the reticle 12. At this time, based on the pattern distribution (energy distribution) obtained from the signal from the light amount monitor 58, the main control system 22A calculates the scanning speed of the reticle stage system RST. Then, the drive unit 22C shifts the reticle 12 at the scanning speed calculated by the main control system 22A. Here, in order to correct the magnification error of the reticle pattern caused by the heat-distortion of the reticle 12 in the scanning direction, the speed ratio of the wafer 5 to the reticle 12 does not coincide with the magnification β of the projection optical system 8. Instead of the reticle stage system RST, the scanning speed of the wafer stage system WST may be regulated minutely. Further, in this embodiment, prior to the scanning exposure, the main control system 22A calculates the magnification error of the reticle 12 based on the above-mentioned energy distribution and the imaging characteristics correcting section MC changes the magnification β such that the calculated magnification error becomes zero. Thereby, the influence of the heat-distortion on the reticle 12 in the nonscanning direction (X direction) can be eliminated. That is, the magnification error of the projected image of the reticle pattern in the nonscanning direction (the X direction) can be corrected.

Also, when exposing the image of the reticle pattern on the wafer 5 while the reticle 12 and the wafer 5 are shifted synchronously, the intensity of the reflected light from the wafer 5 can be measured based on the signal from the reflectivity monitor 54. As this reflected light passes again the projection optical system 8, it is necessary to calculate (estimate) changes of the imaging characteristics (the magnification, the position of a focal point, etc.) of the projection optical system 8 in consideration of the output signal from the reflectivity monitor 54. Then, the main control system 8 estimates changes of the imaging characteristics of the projection optical system 8 from the signal input from the reflectivity monitor 54 and makes the imaging characteristics correcting section MC shift at least one of the lens elements of the projection optical system 8 such that the imaging characteristics are kept within a predetermined value. Therefore, the image of the pattern of the reticle 12 is projected on the wafer 6 while the imaging characteristics of the projection optical system 8 is maintained with high accuracy. As to the position of the focal point, the surface of the wafer 5 may be made to coincide with the optimum imaging surface (best focus position) of the projection optical system 8 by slightly shifting the wafer stage system WST in the Z direction without using the imaging characteristics correcting section MC.

Further, when exchanging the aperture stop by rotating the stop member 41, the intensity of the light EL incident on the reticle 12 (wafer 5) is changed. That is, the level (voltage) of the output signal of the integrator sensor 46 is changed. For example, when the aperture stop with a comparatively small opening is disposed, the level of the output signal of the integrator sensor 46 is lowered. At this time, in order to impart an optimum amount of exposure to the wafer 5 by the scanning exposure in accordance with the sensitivity of the photoresist, between the width $L_W$ of the projection area of the reticle pattern, the sensitivity P of the photoresist, the scanning speed $V_W$ of the wafer 5 and the illuminance Q of the light EL on the wafer 5, the equation (5), i.e., $P \times V_W = L_W \times Q$ needs to hold, as mentioned above. Accordingly, when the sensitivity P of the photoresist is input from the keyboard 57, the main control system 22A determines the width $L_W$, the scanning speed $V_W$ and the illuminance Q in accordance with the sensitivity P so as to satisfy the equation (5). In this embodiment, as the field stop 49 has the opening whose width is fixed, the illumination area 52 on the reticle 12, i.e., the width of the projection area of the reticle pattern by the projection optical system 8 in the scanning direction (Y direction) is constant. Then, the main control system 22A converts the output signal of the integrator sensor 46 to the illuminance Q on the wafer 5 and determines the scanning speed $V_W$ so as to satisfy the equation (5) in accordance with the obtained illuminance Q, the width $L_W$ and the sensitivity P. That is, the scanning speed $V_W$ is lowered in accordance with the decrease of the illuminance Q. On the other hand, when the level of the output signal of the integrator 46 becomes high, the scanning speed $V_W$ needs to be raised in accordance with the increase of the illuminance Q. Namely, when the aperture stop is exchanged by rotating the aperture stop 41 and even though the level of the output signal of the integrator sensor 46 (the illuminance Q on the wafer) is changed, it is sufficient to change the scanning speed $V_W$ so as to satisfy the equation (5) after the output signal is converted to the illuminance Q.

Even though the sensitivity P of the photoresist on the wafer is changed, it is possible to impart an optimum amount of exposure to the wafer by determining the width $L_W$, the scanning speed $V_W$ and the illuminance Q so as to satisfy the equation (5) in accordance with the sensitivity P. At this time, it is not necessary to change all of the width $L_W$, the scanning speed $V_W$ and the illuminance Q, and it is sufficient to change one of the width $L_W$, the scanning speed $V_W$ and the illuminance Q.

Then, the case in which the sensitivity of the photoresist on the wafer 5 is high will be discussed. When the sensitivity of the photoresist becomes high, the value of the sensitivity P becomes small. In this embodiment, the width of the opening of the field stop 49 is fixed, i.e., the width $L_W$ is constant. Therefore, in order to satisfy the equation (5), it is necessary to raise the scanning speed $V_W$ of the wafer 5 or to lower the illuminance Q on the wafer 5 in accordance with the decrease of the value of the sensitivity P. However, when the scanning speed $V_W$ is the maximum value, the scanning speed $V_W$ cannot be raised further, whereby an excessive amount of exposure is imparted to the wafer 5. Therefore, in this embodiment, in order to avoid the excessive exposure of the photoresist, the illuminance Q of the light on the wafer 5 is regulated continuously or in stages so as to satisfy the equation (5) by the use of the light reducing filter plate 27 and the power source control unit 24.

Figure 4A:
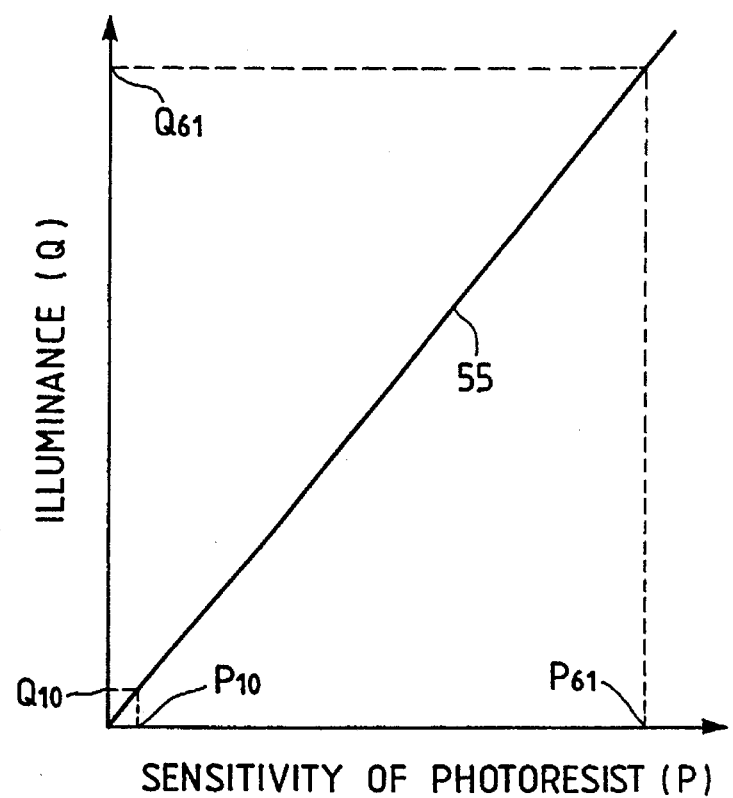
FIG. 4A shows the relationship between the illuminance Q of the light and the sensitivity P of the photoresist.
Figure 4B:
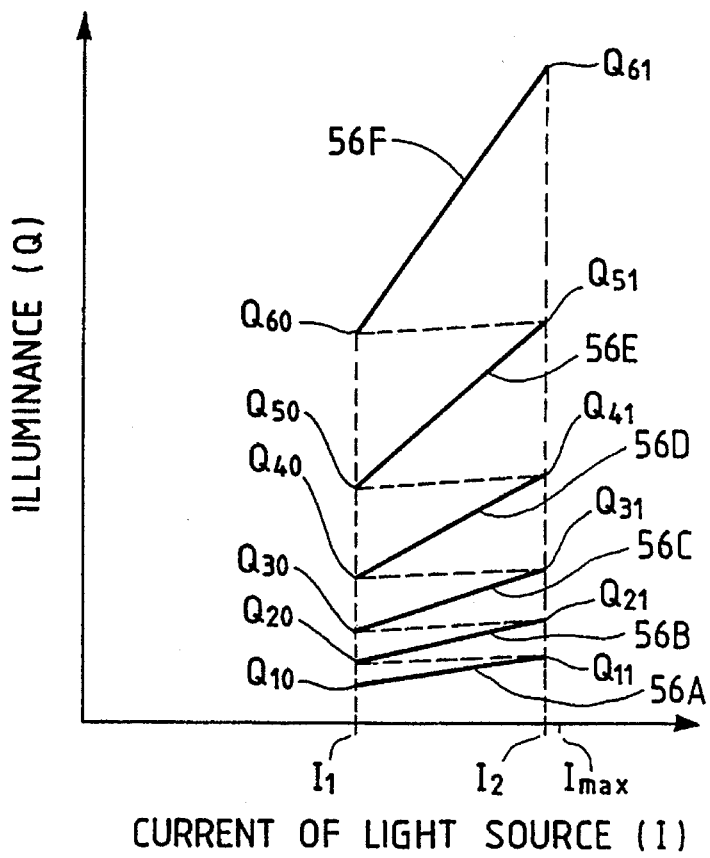
FIG. 4B shows the whole structure of the luminance Q of the light and the current I of the mercury lamp.

That is, when the width $L_W$ and the scanning speed $V_W$ are constant in the equation (5), the illuminance Q of the light and the sensitivity P of the photoresist are in a proportional relation, as indicated by a line 55 in FIG. 4A. A range of the sensitivity P of the photoresist is assumed to be from $P_{10}$ to $P_{61}$. A range of the illuminance Q is assumed to be from $Q_{10}$ to $Q_{61}$ corresponding to $P_{10}$ to $P_{61}$ respectively. Also, when the rated value (the maximum value in the usual use) of the current I supplied to the mercury lamp 23 in FIG. 1 is $I_{max}$, the current I and the illuminance Q are changed approximately linearly in the range wherein the current I is 70% to 100% with respect to the maximum value $I_{max}$. Then, as shown in FIG. 4B, in this embodiment, the current I supplied to the mercury lamp 23 is regulated in the range from the value $I_{max}$ slightly larger than 70% of the maximum value $I_{max}$ to the value $I_2$ (e.g., 98%) slightly smaller than 100% of the maximum value $I_{max}$. The reason why the maximum value $I_2$ of the current I supplied to the mercury lamp 23 is set to about 98% of the maximum value $I_{max}$ is to leave room for increasing the intensity of the light from the mercury lamp 23 by setting the current I larger than the maximum value $I_2$ without exchanging the light reducing filter during exposure when the intensity of the light from the mercury lamp 23 is lowered due to the passage of time.

In the light reducing filter plate 27 of FIG. 3, the transmittance of the filter 27a is 100% and the transmittances of the filters 27b, 27c, ... are made gradually smaller in that order. When the filter with the minimum transmittance is disposed in the light path and the current I is $I_1$, the illuminance Q of the light on the wafer 5 becomes $Q_{10}$ in FIG. 4B. Thereafter, when the current I is increased from $I_1$ to $I_2$, the illuminance Q is increased from $Q_{10}$ to $Q_{11}$ as the line 56A. When disposing the filter with the second smallest in the light path and the current I is decreased to $I_1$, the illuminance Q becomes $Q_{20}$. The illuminance $Q_{20}$ is slightly smaller than the illuminance $Q_{11}$.

Similarly, when switching the transmittance of the light reducing filter plate 27 successively, the illuminance Q is increased to $Q_{20}, Q_{30}, \ldots, Q_{60}$. Further, when the current I is increased to $I_2$, the illuminance Q is increased to $Q_{21}, Q_{31}, \ldots, Q_{61}$ along the respective lines 56B, 56C, ..., 56F. Therefore, according to the present invention, the illuminance Q can be set to any value within $Q_{10}$ to $Q_{61}$ by exchanging the filters of the light reducing filter plate 27 and regulating the current I continuously. The range of the illuminance $Q_{10}$ to $Q_{61}$ corresponds to the range of the sensitivity $P_{10}$ to $P_{61}$.

The illuminance Q of the light on the wafer 5 is constantly monitored by means of the output signal of the integrator sensor 46. During the scanning exposure, the exposure control unit 25 controls the value of the illuminance Q via the power source control unit 24 and the motor 29 so as to satisfy the equation (5). Thereby, even though the photoresist is highly sensitive (the value of the sensitivity P is small), it is possible to impart an optimum amount of exposure to the wafer 5 in accordance with the sensitivity P by only regulating the illuminance of the light without changing the scanning speed $V_W$ of the wafer 5. Namely, it is possible to project the pattern of the reticle 12 on the wafer 5 under the highly accurate exposure control. At this time, when the illuminance Q is determined to satisfy the equation (5) after the scanning speed $V_W$ of the wafer 5 is set to the maximum value $V_{Wwax}$, the throughput becomes most preferable while an optimum amount of exposure is imparted to the wafer.

On the other hand, when the photoresist has a low sensitivity (the value of the sensitivity P is large), an optimum amount of exposure can be imparted to the wafer 5 by only lowering the scanning speed $V_W$, as is apparent from the equation (5). However, the drop of the scanning speed of the wafer 5 leads to lowering of the throughput. Therefore, even though the photoresist with the low sensitivity is used, the scanning speed $V_W$ of the wafer 5 is not lowered and the exposure control unit 25 controls the value of the illuminance Q via the power source control unit 24 and the motor 29 so as to satisfy the equation (5). Accordingly, the value of the illuminance Q of the light on the wafer 5 becomes large, so it is possible to impart an optimum amount of exposure to the wafer 5 while not lowering the throughput. In particular, when the value of the illuminance Q is determined to satisfy the equation (5) while the scanning speed $V_W$ of the wafer 5 is maintained to the maximum value $V_{Wmax}$, the throughput becomes most preferable while an optimum amount of exposure is imparted to the wafer 5.

In accordance with the change in illuminance Q by the driving of the stop member 41, the illuminance Q may be changed by the use of both the power control unit 24 and the light reducing filter plate 27, instead of changing the scanning speed $V_W$ of the wafer 5. Especially, when the value of the illuminance Q is determined to satisfy the equation (5) while maintaining the scanning speed $V_W$ of the wafer 5 to the maximum value $V_{Wmax}$, the throughput becomes most preferable. When the field stop 49 is substituted for a variable stop in addition to the change in illuminance Q by the driving of the stop member 41 and the change in sensitivity P by changing the photoresist, the width $L_W$ of the projection area of the reticle pattern is changed and there occurs a case that the equation (5) is not satisfied. In such a case, the width $L_W$ of the projection area of the reticle pattern in the scanning direction (Y direction) is measured by the light amount monitor 58 on the wafer stage system WST and the value of the illuminance Q is determined to satisfy the equation (5) in accordance with the measured width $L_W$. Then, even though the width $L_W$ of the projection area of the reticle pattern is changed, an optimum amount of exposure can be imparted to the wafer 5 in accordance with the sensitivity P. In particular, when the scanning speed $V_W$ is set to the maximum value $V_{Wmax}$ and then the illuminance Q is determined, the throughput becomes most preferable. Further, when the scanning speed of the wafer 5 (reticle 12) is changed during the scanning exposure, the equation (5) is not satisfied, whereby an optimum amount of exposure cannot be imparted to the whole surface of the wafer 5. Then, during the scanning exposure, the position information (or speed information) from the interferometers 13 and 14 is monitored and in accordance with changes of the scanning speeds of the reticle 12 and the wafer 5, the illuminance Q is changed by the power source control unit 24 and the light reducing filter plate 27 to satisfy the equation (5). As a result, even though the scanning speeds of the reticle 12 and the wafer 5 are changed during the scanning exposure, an optimum amount of exposure can be imparted to the wafer 5 in accordance with the sensitivity P. On the other hand, when the illuminance Q is changed during the scanning exposure, the illuminance Q is changed by the power control unit 24 and the light reducing filter plate 27 so as to satisfy the equation (5), or the scanning speeds of the wafer 5 the reticle 12 are changed by the respective drive units 22B and 22C. As a result, even though the illuminance Q is changed during the scanning exposure, an optimum amount of exposure can be imparted to the wafer 5 in accordance with the sensitivity P. The width $L_W$ of the projection area of the reticle pattern may be formed variably and the equation (5) may be satisfied by changing the width $L_W$ too.

Generally, in scanning type exposure apparatuses for manufacturing semiconductors, the projection optical system is the reduction type. That is, the magnification β is less than 1. Therefore, as is apparent from the equation (2), the scanning speed $V_R$ of the reticle 12 is faster than the scanning speed $V_W$ of the wafer 5. Then, when the upper limit $V_{Rmax}$ of the scanning speed of the reticle 12 (the maximum speed of the reticle stage system RST) is smaller than 1/β times the upper limit $V_{Wmax}$ of the scanning speed of the wafer 5 (the maximum speed of the wafer stage system WST), i.e., $V_{Rmax} < V_{Wmax}$ holds, the scanning speed of the reticle 12 rather than the wafer 5 reaches its upper limit easily. Then, the scanning speed $V_R$ of the reticle 12 always needs to be set to equal to or less than the upper limit $V_{Rmax}$. That is, the above-mentioned expression (7) needs to hold always. When the expression (7) holds, the scanning speed $V_W$ of the wafer 5 will not exceed the upper limit $V_{Wmax}$. Then, in consideration of the upper limit $V_{Rmax}$ of the scanning speed of the reticle 12, in order to impart an optimum amount of exposure to the wafer 5 in accordance with the sensitivity P, it is necessary to determine the width $L_W$ of the projection area, the illuminance Q and the scanning speed $V_W$ of the wafer 5 so as to satisfy both the equations (5) and (7).

For example, when the photoresist has high sensitivity, the width $L_W$ of the projection area of the reticle pattern is narrowed and/or the illuminance Q of the light on the wafer 5 is lessened. Accordingly, even in the highly sensitive photoresist, the scanning speed $V_R$ of the reticle 12 never exceeds the upper limit $V_{Rmax}$ and an optimum amount of exposure can be imparted to the wafer 5. However, in this embodiment, only the illuminance Q is varied. Also, when the scanning speed $V_R$ of the reticle 12 is set to the upper limit $V_{Rmax}$, i.e., the scanning speed $V_W$ of the wafer 5 is set to β·$V_{Rmax}$, the throughput becomes most preferable while an optimum amount of exposure is imparted to the wafer 5.

On the other hand, when the photoresist has a low sensitivity, the value of the left side of the expression (7) becomes small. That is, only the scanning speed $V_R$ of the reticle 12 becomes slow, but it is possible to impart an optimum amount of exposure to the wafer 5. However, in that case, the throughput is decreased. Then, while the scanning speed $V_R$ of the reticle 12 is maintained to the upper limit $V_{Rmax}$, at least one of the width $L_W$ and the illuminance Q is determined in accordance to the sensitivity P so as to satisfy both expressions (5) and (7). At this time, the width $L_W$ of the projection area of the reticle pattern is enlarged and/or the illuminance Q of the light on the wafer 5 is increased. However, in this embodiment, the width $L_W$ is the fixed value and then only the illuminance Q is increased. Therefore, even in the photoresist with the low sensitivity, an optimum amount of exposure can be imparted to the wafer 5 while preventing the throughput from decreasing.

The above description is directed to the case in which $V_{Rmax} < V_{Wmax}/β$ holds, but when $V_{Rmax} \geq V_{Wmax}/β$ holds, the width $L_W$, the illuminance Q and the scanning speed $V_W$ are determined so as to satisfy both the expressions (5) and (8). When the expression (8) holds, the scanning speed $V_R$ of the reticle 12 never exceeds the upper limit $VR_{Rmax}$. Even though all three conditions of the width $L_W$, the illuminance Q and the scanning speed $V_R$ are not formed variably, it is sufficient to determine one or two variable conditions to satisfy both the expressions (5) and (8) such that the scanning speed $V_W$ of the wafer 5 does not exceed the upper limit $V_{Wmax}$ and the throughput is not lowered.

Although emission lines of the mercury lamp 23 is utilized for illumination in the above first embodiment, it is possible to utilize various other light sources emitting continuous light. Also, the intensity of the light of the mercury lamp 23 is changed by changing the current supplied to the mercury lamp 23 in the first embodiment, but may be changed by changing voltage supplied thereto.

Figure 5:
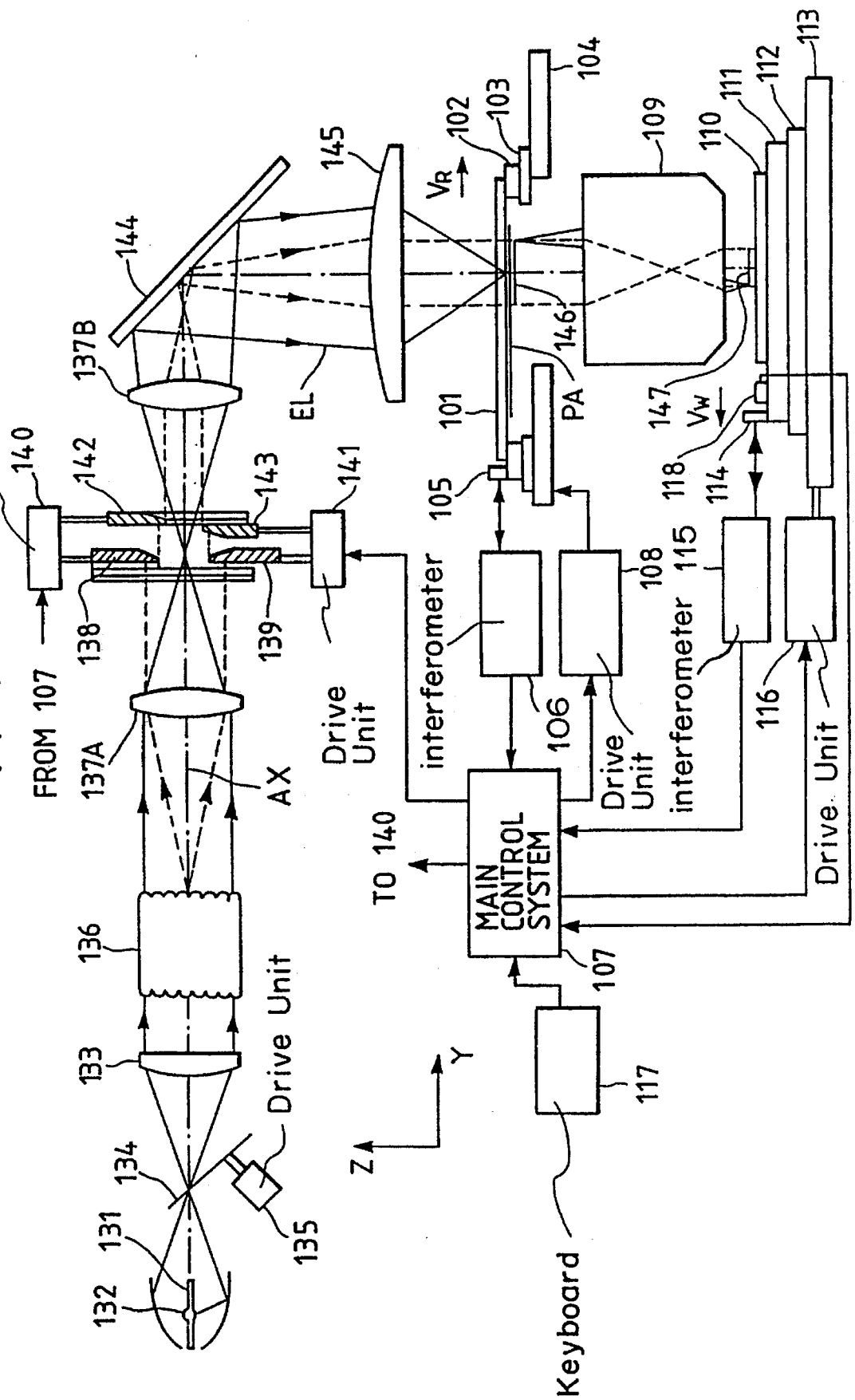
FIG. 5 shows the whole structure of a scanning type projection exposure apparatus according to a second embodiment of the present invention.

Next, a second embodiment of the present invention will be described with reference to FIGS. 5 to 9. FIG. 5 shows the whole structure of a scanning type exposure apparatus according to this embodiment. In FIG. 5, light EL from an illumination optical system illuminates a local illumination area 146 (e.g., a rectangular area elongated in a direction (X direction) perpendicular to the paper of FIG. 5) on a reticle 101. The light EL transmitted through the reticle 101 enters a projection optical system 109 at least the image side of which is telecentric. The projection optical system 109 projects, of the circuit pattern within a pattern area PA on the reticle 101, the image of the circuit pattern within the illumination area 146 to a wafer 110 with a photoresist applied thereto. When the magnification of the projection optical system 109 is β, the reticle 101 is shifted at the speed $V_R$ in the Y direction parallel to the paper of FIG. 5 in the scanning exposure, and the wafer 110 is shifted in the Y direction at the speed $V_W$ ($=\beta \times V_R$) in synchronism with the movement of the reticle 101. Thereby, the light EL illuminates the whole surface of the pattern area PA on the reticle 101 and the pattern image is scanned and exposed on the wafer 110. In this embodiment, the projection optical system 109 is constituted of only a plurality of refracting elements, so the reticle 101 and the wafer 110 are shifted each other in the opposite directions along the Y direction.

A roughly shiftable stage 103 is disposed on a base 104 and a minutely shiftable stage 102 is disposed on the roughly shiftable stage 103. The reticle 101 is supported on the minutely shiftable stage 102 by the vacuum chuck or the like. The roughly shiftable stage 102 can be shifted in the Y direction. The minutely shiftable stage 103 can be shifted slightly in the X and Y directions and the direction of rotation (θ direction) in a plane perpendicular to the optical axis of the projection optical system 109 to position the reticle 101 with high accuracy. A movable mirror 105 is disposed on the stage 102 and positions of the stage 102 in the X, Y and θ directions are monitored by an interferometer 106. The position information obtained by the interferometer 106 is supplied to a main control system 107.

On the other hand, a Y stage 112 shiftable in the Y direction is disposed on a base 113 and an X stage 111 shiftable in the X direction is disposed on the Y stage. The wafer 110 is supported on the X stage 111 via a vacuum chuck or a θ table (not shown). A movable mirror 114 is fixed to the X stage 111 and positions of the X stage 111 in the X, Y and 8 directions are monitored by an interferometer 115. The position information from the interferometer 115 is supplied to the main control system 107 too. The main control system 107 performs alignment of the reticle 101 and the wafer 110 via drive units 108 and 116, controls constant movements of the reticle 101 and the wafer 110 during the scanning exposure. Besides, the main control system 107 controls the whole operation of the apparatus.

Also, e.g., as disclosed in U.S. Pat. No. 4,465,368, on the X stage 111 is provided a photoelectric detecting device (a light amount monitor formed such as of a photomultiplier, a photodiode, etc.) 118 for receiving a portion of the light EL. The light receiving surface of the light amount monitor 118 and the upper surface of the wafer 110 are located approximately at the same height. A photoelectric signal from the light amount monitor 118 is also supplied to the main control system 107, which then can measure the illuminance Q of the light on the wafer 110 and the width $L_W$ of the projection area of the reticle pattern in the scanning direction. A keyboard 117 is connected to the main control system 107 and the operator inputs the sensitivity P of the photoresist on the wafer 110 to the main control system 107 via the keyboard 117.

In FIG. 5, the light (e.g., i-lines with the wavelength of 365 nm) emitted from a mercury lamp 131 is condensed by an elliptical mirror 132 and thereafter converted by an input lens 133 to approximately a flux of parallel rays to be incident on a fly eye lens 136. A shutter 134 is disposed in the vicinity of the second focal point of the elliptical mirror 132. The shutter 34 is opened and closed by a drive unit 135 to control the exposure time and the like.

A plurality of secondary light sources (surface illuminant image) are formed in a focal surface on the side of the plane of emission of the fly eye lens 136. The light from the secondary light sources passes a first relay lens 137A and illuminates movable light shielding plates 138 and 139 with uniform illuminance. The light passing an opening of the movable light shielding plates 138 and 139 reaches a variable field stop (reticle blinds) 142 and 143 disposed away from the movable light shielding plates 138 and 139 in the direction of the optical axis AX. The width of an illumination area 146 on the reticle 101 in the scanning direction is determined by an opening formed by the reticle blinds 142 and 143. The movable light shielding plate 138 and the reticle blind 142 are connected to a drive unit 140 while the movable light shielding plate 139 and the reticle blind 143 are connected to a drive unit 141. The light shielding plates 138 and 139 are driven in accordance with movements of the reticle 101 and the wafer 110 during the scanning exposure. That is, the width of the opening of the light shielding plates 138 and 139 is changed. The positions of the reticle blinds 142 and 143 are fixed, so the width of the opening of the reticle blinds 142 and 143 will not be changed during the scanning exposure.

In this embodiment, in accordance with the sensitivity P of the photoresist, the scanning speed $V_R$ of the reticle 101 (the scanning speed $V_W$ of the wafer 110) and the illuminance Q of the light on the wafer 110, the main control system 107 changes the width of the opening of the reticle blinds 142 and 143 by driving them with the respective drive units 140 and 141 and sets the width $L_R$ of the illumination area 146 on the reticle 101 in the scanning direction (Y direction), i.e., the width $L_W$ of the projection area of the reticle pattern on the wafer 110 in the Y direction so as to satisfy the equation (5). Further, the main control system 107 controls positions of the movable light shielding plates 138 and 139 by means of the drive units 140 and 141 during the scanning exposure.

Figure 6:
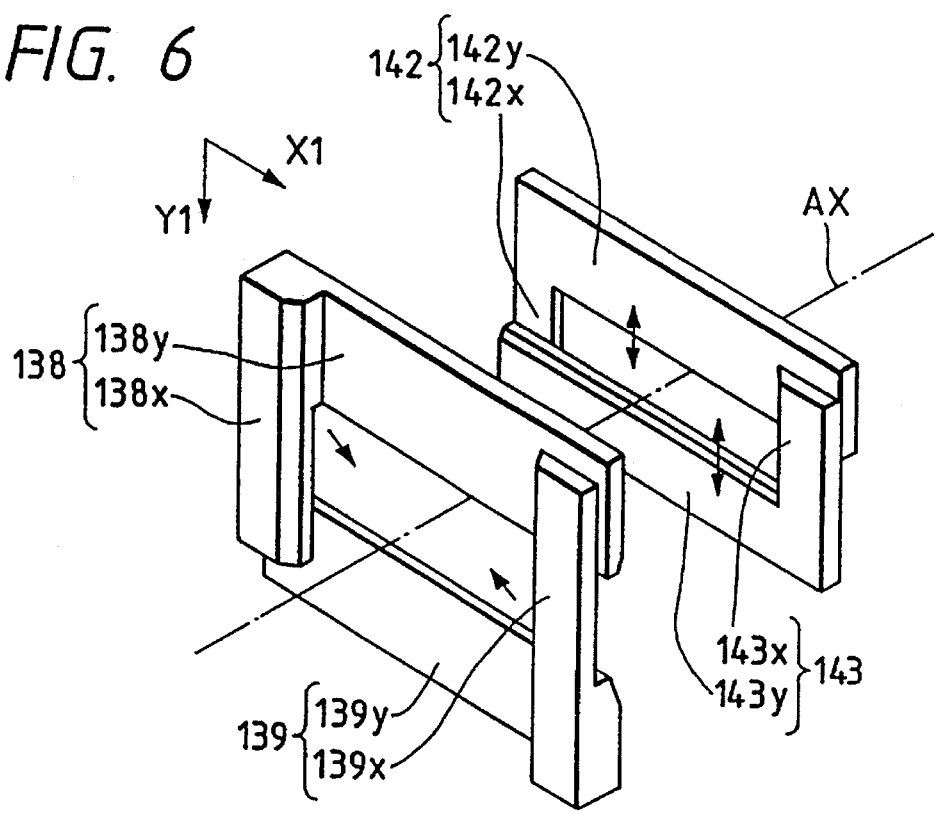
FIG. 6 shows the structure of movable light shielding plates and reticle blinds of FIG. 5.

FIG. 6 shows the arrangement of the movable light shielding plates 138 and 139 and the reticle blinds 142 and 143 along the optical axis AX of the illumination optical system. In FIG. 6, the direction corresponding to the scanning direction (Y direction) of the reticle 101 is Y1 and the direction corresponding to the nonscanning direction (X direction) is X1.

The movable light shielding plate 138 is formed integrally of a blade 138y extending perpendicularly to the Y1 direction and a blade 138x whose edge extends perpendicularly to the X1 direction. The movable light shielding plate 139 is formed integrally of a blade whose edge 139y extends perpendicularly to the Y1 direction and a blade 139x whose edge extends perpendicularly to the X1 direction. The blades 138y, 139y and the blades 138x, 139x are displaced in the direction of the axis AX so as not to interfere with each other. The movable light shielding plates 138 and 139 are supported so as to be shiftable in the X1 and Y1 directions. The illumination area 146 of the reticle 101 is limited in the Y direction by the blades 138y and 139y and limited in the X direction by the blades 138x and 139x.

The reticle blind 142 is an L-shaped light shielding member (blade) integrally formed of a knife edge 142y extends perpendicularly to the Y1 direction and a knife edge 142x extending perpendicularly to the X1 direction. On the other hand, the reticle blind 143 is an L-shaped light shielding member (blade) integrally formed of a knife edge 143y extending perpendicularly to the Y1 direction and a knife edge 143x extending perpendicularly to the X1 direction. The reticle blinds 142 and 143 are displaced from each other in the direction of the optical axis AX and can be shiftable in the X1 and Y1 directions.

Referring to FIG. 5 again, the light passing the rectangular opening surrounded by the movable light shielding plates 138 and 139 reaches the reticle blinds 142 and 143. Further, the light passing the rectangular opening surrounded by the reticle blinds illuminates the reticle 101. Namely, the light EL passing the opening of the reticle blinds 142 and 143 illuminates the illumination area 146 on the reticle 101 with uniform illuminance via a second relay lens 137B, a mirror 144 and a condenser lens 145. More specifically, the illumination area 146 is defined by the opening of the reticle blinds 142 and 143 and the light EL illuminates an area where the illumination area 146 is overlapped with an illumination field defined by the opening of the movable light shielding plates 138 and 139. The pattern of the reticle 101 is projected to an area 147 conjugate to the illumination area 146 with respect to the projection optical system 109.

Of the movable light shielding plates 138 and 139, the blades 138y and 139y (FIG. 6) for setting an illumination field on the reticle 101 in the scanning direction (Y direction) are disposed in a plane conjugate to the pattern surface of the reticle 101 and the blades 138x and 139x for setting an illumination field in the nonscanning direction (X direction) are displaced slightly from the conjugate plane toward the first relay lens 137A (or placed in a defocus position). The reticle blinds 142 and 143 are displaced (defocus) from the plane conjugate to the pattern surface of the reticle 101 toward the second relay lens 137B at a predetermined distance.

Figure 7:
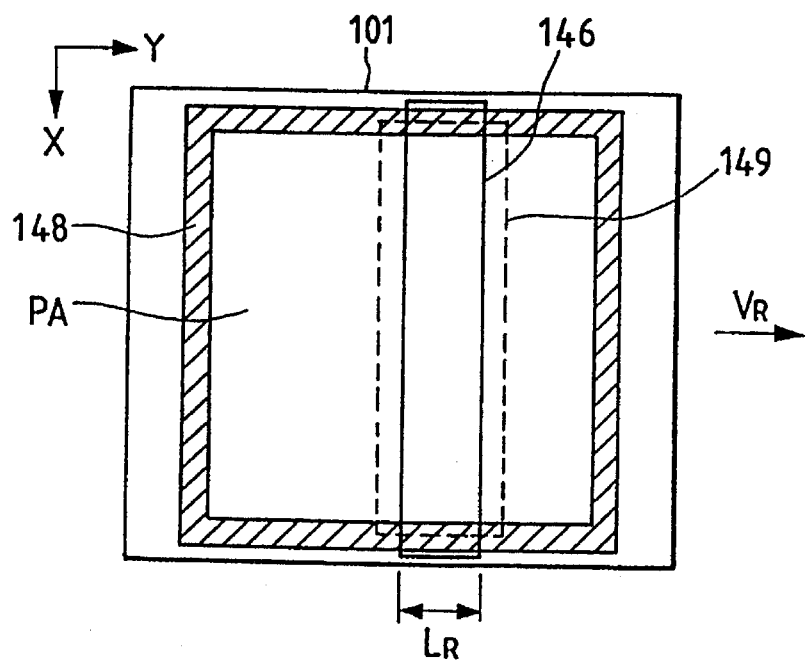
FIG. 7 shows the illumination area on the reticle of FIG. 5.

Next, the operation of the scanning exposure of this embodiment will be described. FIG. 7 shows the structure of the reticle 101. The image of the pattern within the pattern area PA on the reticle 101 is transferred on the wafer 110 in the scanning exposure. The pattern area PA is surrounded by a light shielding zone 148 having a predetermined width. As mentioned above, the light EL illuminates the area on the reticle 101 where the illumination area 146 defined by the reticle blinds 142 and 143 is overlapped with the illumination area 149 defined by the movable light shielding plates 138 and 139. When two edges of the illumination area 146 extending in the nonscanning direction (X direction) are located within the pattern area PA, two edges of the illumination area 149 extending in the X direction are located outside the illumination area 146. Further, two edges of the illumination area 149 in the Y direction are located within the light shielding zone 148 and two edges of the illumination area 146 extending in the Y direction are located outside the light shielding zone 148.

When one of the two edges of the illumination area 146 extending in the X direction comes outside the light shielding zone 148 at the time of the start or end of the scanning exposure, the movable light shielding plate 138 or 139 is shifted to make one of the two edges of the illumination area 149 extending in the X direction remain within the light shielding zone 148. Thereby, there is no light reaching the wafer 110 while passing outside the light shielding zone 148, so that the wafer 110 will not be exposed unnecessary.

Figure 8:
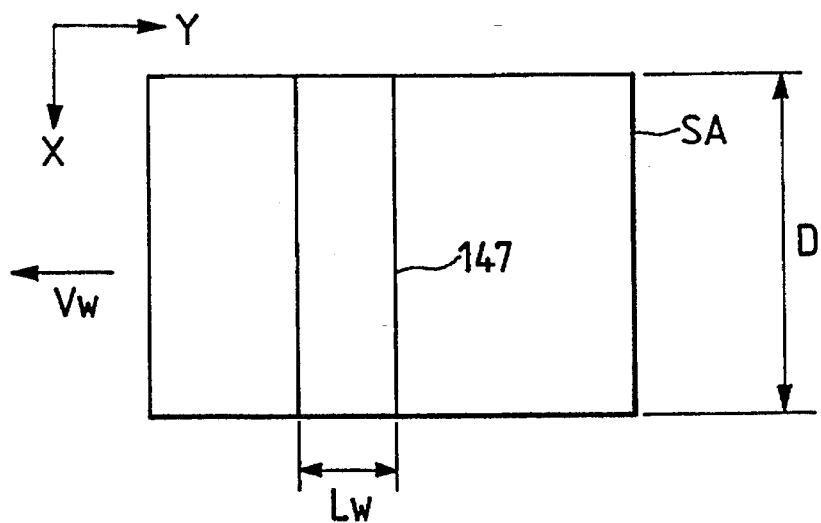
FIG. 8 shows the projection area of the reticle pattern on the wafer of FIG. 5

FIG. 8 shows a shot area SA of the wafer 110 on which the circuit pattern within the pattern area PA is transferred.

The image of the pattern within the illumination area 146 of FIG. 7 is projected to the rectangular area 147 on the shot area SA. The width of the rectangular area (the projection area of the reticle pattern by the projection optical system) 147 in the Y direction is $L_W$, and the width thereof in the X direction is D. The wafer 110 is shifted at the scanning speed $V_W$ in the −Y direction (the leftward direction in the drawing) with respect to the rectangular area 147. In this embodiment, the reticle blinds 142 and 143 are driven in accordance with the sensitivity P of the photoresist on the wafer 110. Namely, the width $L_R$ of the illumination area 146 on the reticle 101, i.e., the width $L_W$ of the projection area 147 of the reticle pattern is set so as to satisfy the equation (5).

For example, the case in which the magnification β of the projection optical system 109 is ⅕, the width $L_W$ of the rectangular area 147 on the wafer 110 is 10 [mm], the illuminance Q of the light on the wafer 110 is 800 [mW/cm$^2$], the maximum value $V_{Rmax}$ of the scanning speed $V_R$ of the reticle 101 is 250 [mm/sec], the sensitivity P of the photoresist is 200 [mJ/cm$^2$] is considered. At this time, the optimum exposure time t at a point on the wafer 110 is from the equation (3) as follows:

$$t=P/Q=200/800=0.25[\text{sec}].$$

The scanning speed $V_R$ of the reticle 101 is from the equation (6) as follows:

$$V_R=L_W\times Q/(\beta\times P)=5\times 10/0.25=200[\text{mm/sec}].$$

Further, from the equation (6), the range of the sensitivity P of the photoresist when $V_R>V_{Rmax}$ is as follows:

$$P<L_W\times Q/(\beta\times V_{Rmax})=5\times 10\times 800/250=160[\text{mJ/cm}^2].$$

Then, in a highly sensitive photoresist with the sensitivity P of 160 [mJ/cm$^2$] or less, the scanning speed $V_R$ of the reticle exceeds the maximum speed $V_{Rmax}$. Therefore, for example, when using a photoresist with the sensitivity P of 100 [mJ/cm$^2$] and when setting the scanning speed $V_R$ of the reticle to the upper limit 250 [mm/sec], the width $L_W$ of the projection area 147 is determined from the equation (6) as follows:

$$L_W=V_R\times\beta\times P/Q=(250\times 1/5\times 100)/800=6.25[\text{mm}].$$

Although the scanning speed $V_R$ of the reticle is set to the maximum speed $V_{Rmax}$, it is because when the scanning speed $V_R$ is made as large as possible, the exposure time is shortened and it is advantageous in terms of the throughput. Therefore, while the scanning speed $V_R$ is fixed to $V_{Rmax}$, only the width $L_W$ may be varied in accordance with the change of the sensitivity P of the photoresist. If the limitation of the throughput is comparatively loose, the scanning speed $V_R$ of the reticle may be lowered from the maximum speed $V_{Rmax}$. Also, as mentioned in the first embodiment, the illuminance Q may be made variable and both the width $L_W$ and the illuminance Q may be changed so as to satisfy the equation (5) and so as to correspond to the sensitivity P of the photoresist.

After the width $L_W$ of the projection area 147 is determined as above, the main control system 107 changes the width of the opening of the reticle blinds 142 and 143 by driving the reticle blinds 142 and 143 by means of the drive units 140 and 141. Thereby, it is possible to impart an optimum amount of exposure to the whole shot areas on the wafer 110 in accordance with the sensitivity P of the photoresist in the scanning exposure. At this time, prior to the start of the scanning exposure, the main control system 107 may measure the width $L_W$ of the projection area 147 by the use of the light amount monitor 118 to check the setting accuracy of the reticle blinds 142 and 143. In that case, when the setting accuracy of the reticle blinds 142 and 143 is not preferable, the width of the opening thereof is reset by driving the reticle blinds 142 and 143 by means of the drive units 140 and 141, thereby making it possible to set the width $L_W$ of the projection area 147 to the previously calculated value with accuracy. Also, instead of changing the width $L_W$ by driving the reticle blinds 142 and 143, the scanning speed $V_R$ of the reticle and/or the illuminance Q may be changed so as to satisfy the equation (6). The main control system 107 drives the Y stage 112 to make the light amount monitor 118 traverse the projection area 147 of the reticle pattern defined by the projection optical system 109 in the Y direction and obtains the width $L_W$ of the projection area 147 in the Y direction in accordance with the photoelectric signal from the light amount monitor 118 and the position information from the interferometer 115.

In the meantime, in accordance with the change of the mercury lamp 131 due to the passage of time, there is a danger that the illuminance Q on the wafer 110 is gradually reduced. Then, prior to the scanning exposure, the light amount monitor 118 is shifted in the image field of the projection optical system 109, i.e., the projection area 147 by driving the X and Y stages 111 and 112 and the illuminance Q is obtained based on the photoelectric signal from the light amount monitor 118. Then, based on the obtained illuminance Q, the width $L_W$ of the projection area 147 is calculated from the equation (6) and the reticle blinds 142 and 143 are shifted in accordance with the calculated width $L_W$. Accordingly, even though the illuminance Q is changed because of the change of the mercury lamp 131, exposure control accuracy will not be deteriorated, so that an optimum amount of exposure can be imparted to the wafer 110 in accordance with the sensitivity P of the photoresist.

Figure 9:
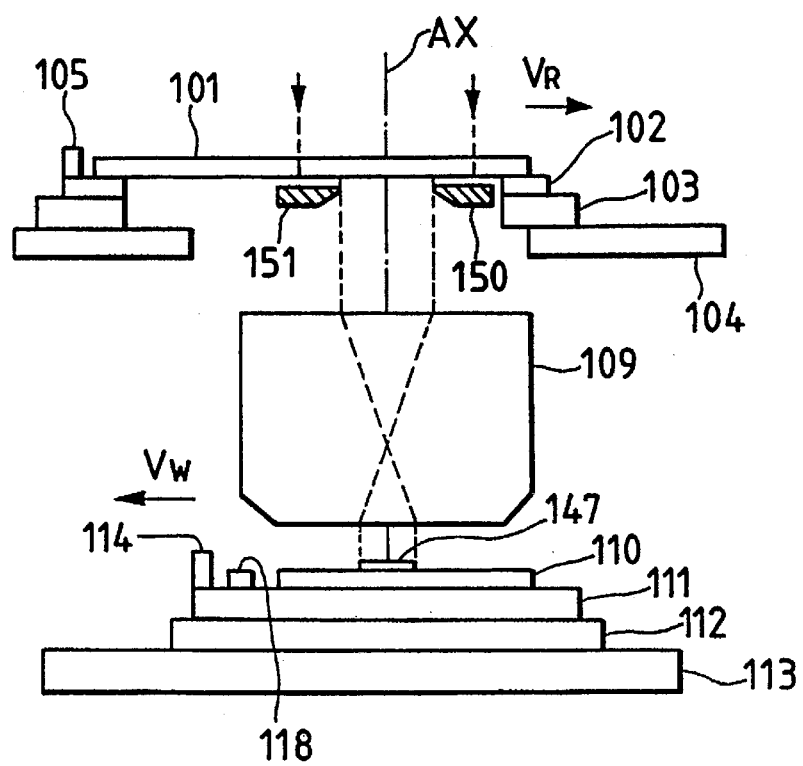
FIG. 9 shows another example of the reticle blinds of FIG. 5.

In this embodiment, the width $L_W$ of the projection area 147 of the reticle pattern on the wafer 110 in the scanning direction is set by the reticle blinds 142 and 143 disposed in the vicinity of the plane conjugate to the pattern surface of the reticle 101 in the illumination optical system. However, as shown in FIG. 9, the width $L_W$ of the projection area 147 on the wafer 110 may be set by reticle blinds 150 and 151 disposed close to the pattern surface of the reticle 101. In FIG. 9, elements identical to those in FIG. 5 are designated by the same reference numerals. The reticle blinds 150 and 151 are L-shaped movable blades (only shown in cross section in FIG. 9).

As described above, although only the illuminance Q is changed in accordance with the change of the illuminance Q due to the drive of the stop member 41 in the first embodiment, the width $L_W$ of the projection area is changed in this embodiment. Also, when the scanning speeds of the reticle and the wafer are changed, the width $L_W$ are changed by driving the reticle blinds 142 and 143 in accordance with the position information (or speed information) from the interferometers 106 and 115. Thereby, even though the scanning speeds are changed during the scanning exposure, an optimum amount of exposure can be imparted to the wafer in accordance with the sensitivity P. Further, even though the illuminance Q is changed during the scanning exposure, the width $L_W$ should be changed by driving the reticle blinds 142 and 143 so as to satisfy the equation (6). In this case, it is preferable to provide the integrator sensor 46 (FIG. 1) and to drive the reticle blinds 142 and 143 in accordance with the output signal thereof.

Figure 10:
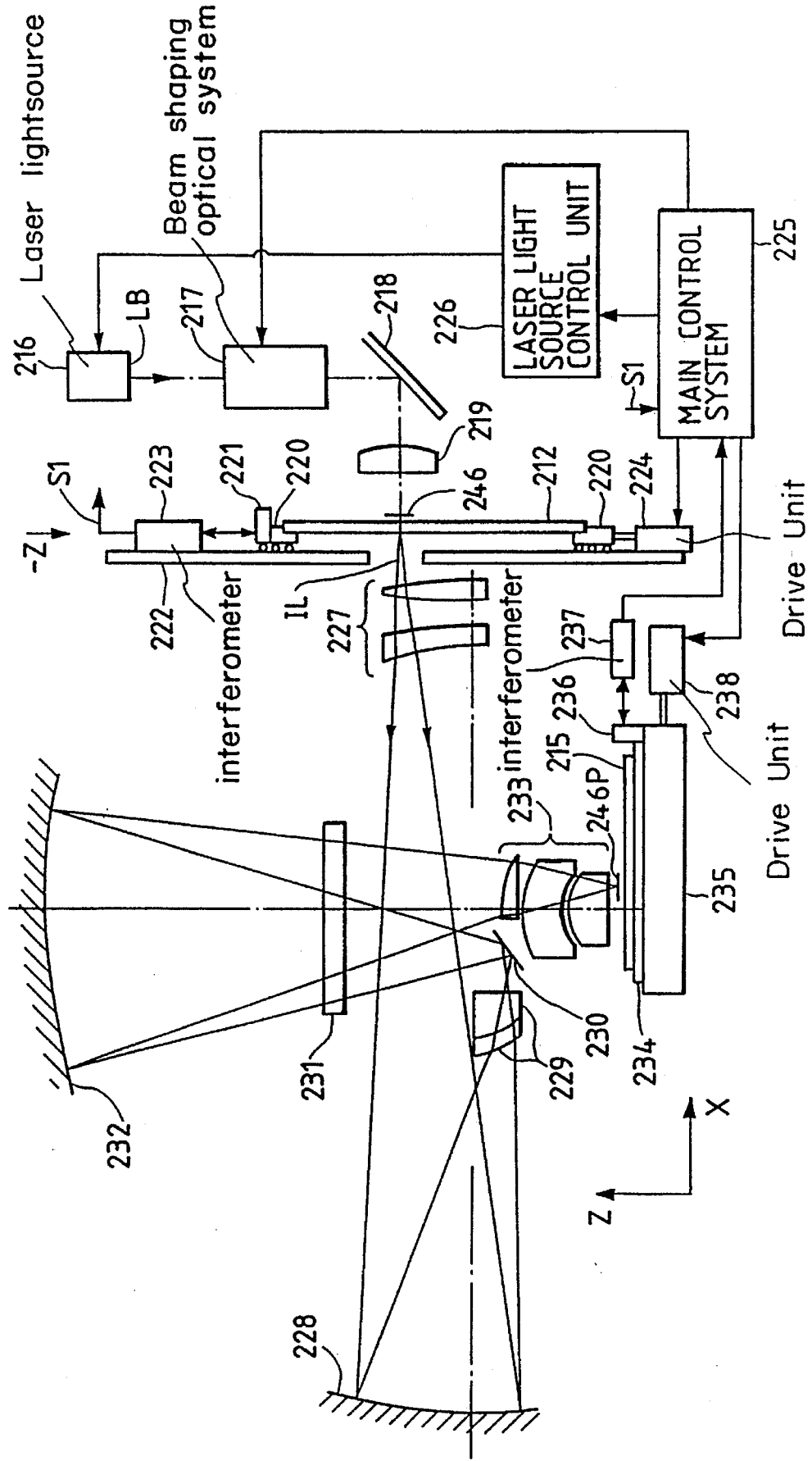
FIG. 10 shows the whole structure of a scanning type projection exposure apparatus according to a third embodiment of the present invention.

Next, a third embodiment of the present invention will be described with reference to FIGS. 10 to 12. In this embodiment, the present invention is applied to a scanning type projection exposure apparatus equipped with a pulse oscillation type laser light source and a reflecting and refracting projection optical system. FIG. 10 shows the whole structure of the scanning type projection exposure apparatus of this embodiment.

In FIG. 10, a laser beam LB emitted from a pulsed laser light source 216 such as an excimer laser light source, etc. is incident on a beam shaping optical system 217 having a beam expander, an optical integrator, an aperture stop, a relay lens system, a variable field stop, and the like. The laser beam IL emitted from the beam shaping optical system 217 illuminates a reticle 212 with uniform illuminance via a mirror 218 and a condenser lens 219.

The reticle 212 is supported on a reticle stage 220, which is shiftable at a constant speed along a guide 222 in a Z direction (a vertical direction in FIG. 10). A reticle stage 220 is provided with a movable mirror 221 for reflecting a laser beam from an interferometer 223 fixed to the guide 222. A drive unit 224 is connected to the reticle stage 220 to shift the reticle stage 220 in the Z direction and to slightly rotate the reticle stage 220 for correction of yawing, etc. The position of the reticle 212 in the Z direction and the amount of yawing thereof are constantly measured by the interferometer 223. These measured data S1 are supplied to a main control system 225. The main control system 225 shifts the reticle stage 220 via the drive unit 224 and controls the operation of the pulsed laser light source 216 via a laser light source control unit 226. Besides, the main control 225 controls the whole operation of the apparatus.

The pulsed laser light IL passed through the pattern of the reticle is led via a first lens group 227 to a first concave mirror 228. Due to the reflection by the first concave mirror 228, a predetermined reduced magnification can be obtained. The pulsed laser light reflected by the first concave mirror 228 passes a second lens group 229 and is reflected by a plane reflecting mirror 230 to be incident on a second concave mirror 232 via a negative lens 231. Due to the reflection by the second concave mirror 232, a magnification slightly larger than the life-size is imparted to the pulsed laser light. The pulsed laser light reflected by the second concave mirror 232 again passes the negative lens 231 and is given a reduced magnification by a third lens group 233 to be incident on a wafer 215. The pattern on the reticle 212 within an illumination area 246 is projected on the wafer 215 at the magnification of ×¼. In this embodiment, the projection optical system is constituted of the elements from the first lens group 227 to the third lens group 233.

The wafer 215 is supported on a slightly rotatable wafer holder 234. The wafer holder 234 is fixed on a wafer stage 235. The wafer stage 235 has an XY stage for positioning the wafer 215 in the horizontal and vertical directions (X and Y directions) in the paper of FIG. 10, a Z stage for positioning the wafer 215 in the Z direction, and the like. A movable mirror 236 is fixed on the wafer stage 235 to reflect a laser beam from an interferometer 237. The interferometer 237 constantly measures the position and the amount of yawing of the wafer 215 in the XY plane. These measured data are supplied to the main control system 225. The main control system 225 controls the operation of the wafer stage 235 via a drive unit 238.

Figure 11:
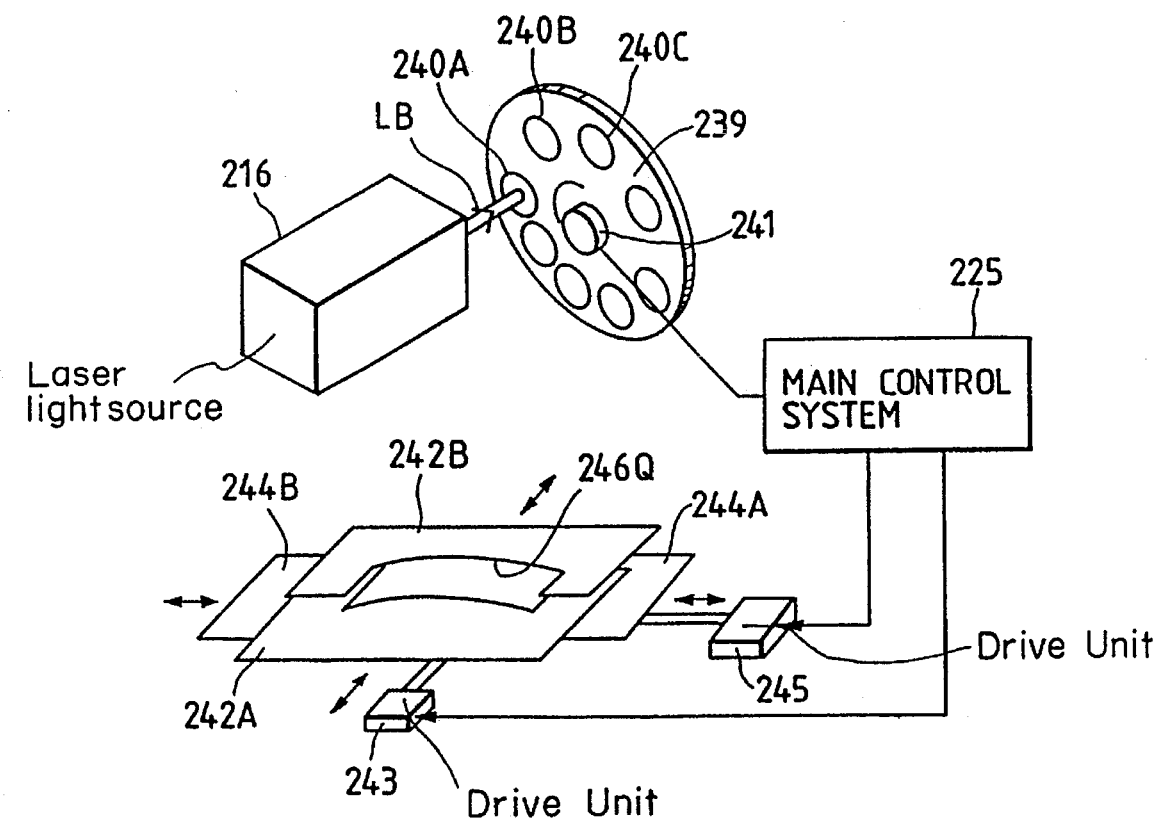
FIG. 11 shows the beam shaping optical system of FIG. 10.
Figure 12:
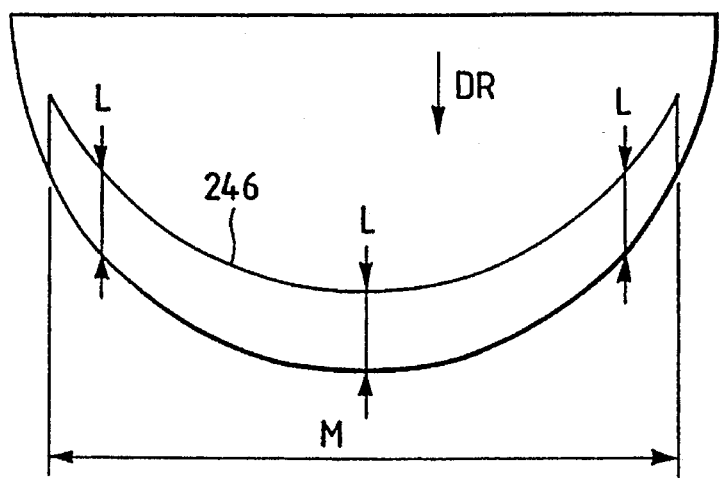
FIG. 12 shows the circular arc-shaped illumination area on the reticle of FIG. 10.

FIG. 11 schematically shows the structure of a portion of the beam shaping optical system 217 of FIG. 12. A rotating plate 239 is disposed in the light receiving section of the beam shaping optical system 217. The peripheral portion of the rotating disk is provided with ND filter 240A, 240B, 240C, . . . , having different transmittances with respect to the laser beam LB. The main control system 225 can set the illuminance of the pulsed laser light IL illuminating the wafer 215 within a desired range by adjusting the angle of rotation of the rotating plate 239 via a drive unit 241. A light amount monitor (not shown) is disposed on the wafer stage 235 for monitoring the illuminance of the pulsed laser light IL.

In FIG. 11, two long blades 242A, 242B and two short blades 244A, 244B constitute a variable field stop. The illumination area 246 on the reticle 212 is defined by a circular arc-shaped opening 246Q surrounded by the four blades 242A, 242B, 244A, 244B. The main control system 225 can adjust the size of the opening 246Q by adjusting the distance between the blades 242A and 242B via a drive unit 243 and the distance between the blades 244A and 244B. The projected image of the opening 246Q on the pattern surface of the reticle 212 is the circular arc-shaped illumination area 246.

FIG. 12 shows the illumination area 246 on the reticle 212. The illumination area 246 is a circular arc-shaped area surrounded by two parallel circular arcs having the distance L and two parallel straight lines having the distance M. That is, the width of the illumination area 246 in the longitudinal direction is M and the width of the illumination area 246 in the direction (DR direction) perpendicular to the longitudinal direction is L anywhere. While scanning the reticle 212 in the DR direction, laser beams illuminate, via the illumination area 246, the pattern area on the reticle 212 successively. The DR direction in FIG. 12 is the −Z direction in FIG. 10.

In this embodiment, during the scanning exposure, the reticle 212 is scanned in the −Z direction (DR direction in FIG. 12) at a constant speed V by means of the drive unit 224 and the reticle stage 220 while laser beams IL are directed to the illumination area 246. The image of the pattern of the reticle 212 within the illumination area 246 is projected to an exposure area 246P on the wafer 215 conjugate to the illumination area 246. When the magnification of the projection optical system (227 to 233) is $\beta$ ($\beta=\frac{1}{4}$ in this embodiment), the wafer 215 is scanned by the drive unit 238 and the wafer stage 235 in the X direction at a constant speed $\beta \cdot V$.

In scanning the reticle 212 and the wafer 215, for example, the difference between the measured value of the interferometer 223 and the measured value of the interferometer 237, when an alignment mark on the reticle 212 coincides with an alignment mark on the wafer 215, is stored as the reference value. And, the operation of the drive units 224 and 238 are controlled such that the difference between the measured value of the interferometer 223 and the measured value of the interferometer 237 becomes the reference value. Therefore, the reticle 212 and the wafer 215 are scanned constantly in a predetermined relation with respect to the illumination area 246 and the exposure area 246P respectively.

Next, the condition of the width of the circular arc-shaped exposure area 246P in the scanning direction will be described.

Figure 13A:
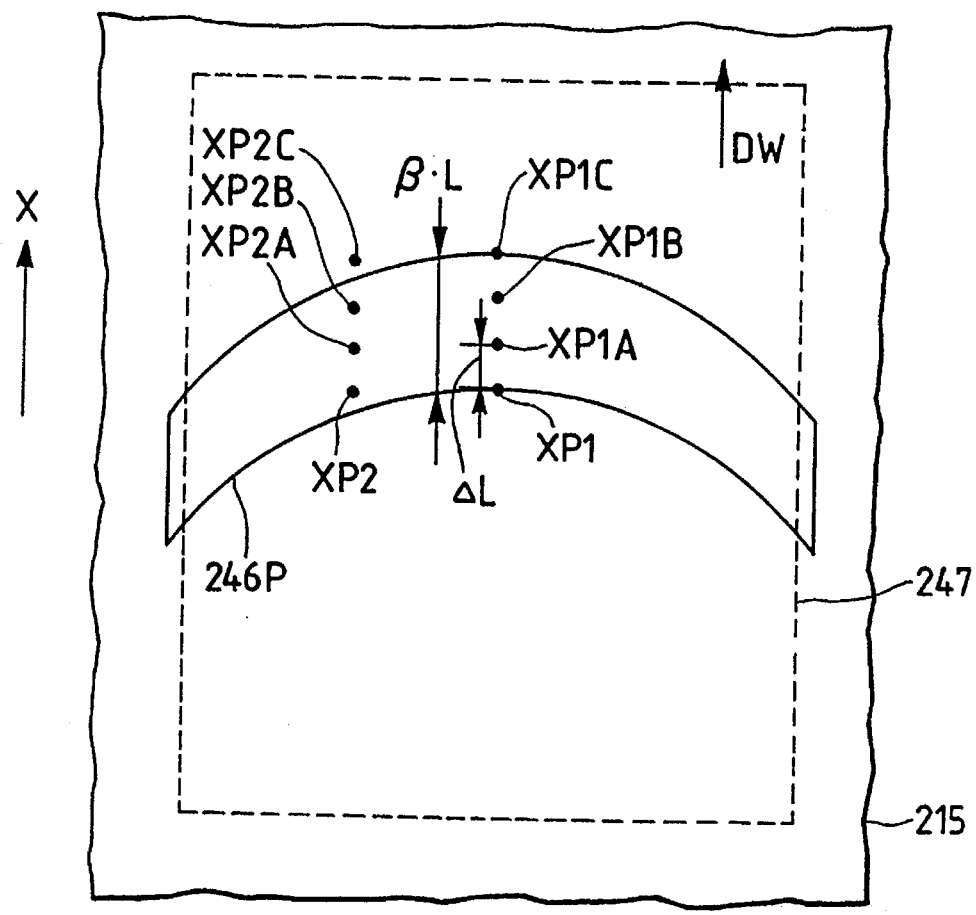
FIG. 13A shows the circular arc-shaped projection area of the reticle pattern on the wafer.

FIG. 13A shows the exposure area 246P on the wafer 215 in this embodiment. In FIG. 13A, when the direction in which the wafer 215 is scanned with respect to the exposure area 246P is a DW direction (corresponding to the X direction in FIG. 10), the width of the exposure area 246P in the DW direction is $\beta \cdot L$. The period (the reciprocal of the frequency of light emission) of the light emission of the pulsed laser light source 216 is T. The distance by which the wafer 215 is scanned in the DW direction per period T during the scanning exposure is $\Delta L$. In this case, the width $\beta \cdot L$ of the exposure area 246P in the DW direction is set to an integral multiple of the distance $\Delta L$. Also, as the scanning speed of the wafer 215 in the DW direction is $\beta \cdot V$, the distance $\Delta L$ is $T \cdot \beta \cdot V$. That is, letting n be an integer of 1 or more, the following equation holds:

$$\beta \cdot L = n \cdot \Delta L = n \cdot T \cdot \beta \cdot V.$$

In FIG. 13A, the case in which n=3, i.e., $\beta \cdot L = 3 \cdot \Delta L$ is shown. In this case, for example, a point XP1 on the wafer 215 located on an edge of the exposure area 246P in the emission of a laser beam is scanned successively at positions XP1A, XP1B and XP1C in that order in the following emissions of laser beams in that order. If the exposure energy imparted to each exposure point within the exposure area 246P in the emission of a laser beam is $\Delta E$, the exposure energy of $3 \cdot \Delta E (= \Delta E/2 + 2 \cdot \Delta E + \Delta E/2)$ is imparted to the exposure point XP1. Also, for example, an exposure point XP2 on the wafer 215 located inside the edge of the exposure area 246P in the emission of a laser beam is scanned successively at positions XP2A, XP2B and XP2C in that order in the following emissions of laser beams. The exposure energy of $3 \cdot \Delta E$ is imparted to the exposure point XP2. Therefore, in this embodiment, all the exposure points on the wafer 215 scanned by the exposure area 246P receives the same exposure energy of $n \cdot \Delta E$. As a result, unevenness of illuminance does not occur and imaging characteristics on the wafer is improved. However, as the exposure energy is varied for each emission of laser beams, the influence of such variations will be described later.

Figure 13B:
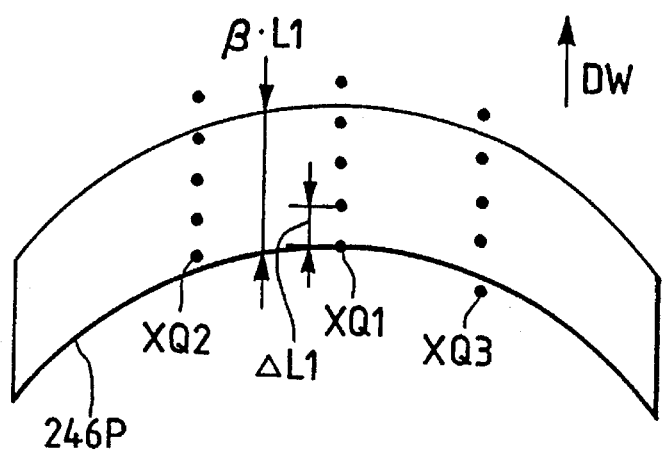
FIG. 13B shows a circular arc-shaped projection area of the reticle pattern when not applying the third embodiment.

On the other hand, in FIG. 13B, the width of the exposure area 246P in the DW direction is $\beta \cdot L_1$. The width $\beta \cdot L_1$ is 3.5 times the distance $\Delta L_1$ by which the wafer 215 is scanned in the DW direction for the period T during the scanning exposure. In this case, the exposure energy of $3.5 \cdot \Delta E$ is imparted to an exposure point XQ1 on the wafer 215 located on the edge of the exposure area 246P. The exposure energy of $4 \cdot \Delta E$ is imparted to an exposure point XQ2 on the wafer 215 located inside the edge of the exposure area 246P. The exposure energy of $3 \cdot \Delta E$ is imparted to an exposure point XQ3 on the wafer located outside the edge of the exposure area 246P. Therefore, unevenness of illuminance (unevenness of the amount of light) occurs.

Next, the operation of the scanning exposure of this embodiment will be described. First, in FIG. 10, the scanning speed $\beta \cdot V$ of the wafer 215 in the X direction is determined in accordance with the average illuminance E of the pulsed laser light IL on the wafer 215 per pulse, the sensitivity of the photoresist and the variation $\Delta E_i$ (i=1, 2, . . . ) of the illuminance of the pulsed laser light IL for each emission. As mentioned above, in this embodiment, as the pulsed laser light IL illuminate each exposure point on the wafer 215 n times, the integrated exposure amount ET becomes as follows. $\Sigma$ means the sum from 1 to n with respect to the letter i.

$$ET = \Sigma(E + \Delta E_i).$$

Thereby, it is known that as the number n of times in which the pulsed laser light IL is emitted is increased, the variation of the integrated exposure amount, i.e., the unevenness of the exposure amount is reduced. Accordingly, depending on the matter that the variation of the integrated exposure amount ET is limited to what extent, the value n (the number of pulses) is determined. For example, n is set to 20, the unevenness of the light amount is limited to about 0.05%. Also, as the integrated exposure amount ET for each exposure point on the wafer 215 is n·E, it is determined to what extent the intensity of the laser beam LB should be set in accordance with the sensitivity of the photoresist P. In order to set the intensity of the laser beam LB to the determined value, the main control system 225 rotates the rotating plate (FIG. 11) to position the ND filter with the desired transmittance.

Next, as shown in FIG. 12, in response to the width L of the illumination area 246 on the reticle 212 in the DW direction, the scanning speeds of the reticle and the wafer 215 are set. First, in FIG. 13A, the width of the exposure area 246P on the wafer 215 in the DW direction is β·L. The scanning speed of the wafer 215 in the DW direction is β·V. The distance by which the wafer 215 is shifted in the DW direction for the period T of the light emission of the pulsed laser light source 216 is T·β·V. Then, the following equation holds:

$$\beta \cdot L = n \cdot \Delta L = n \cdot T \cdot \beta \cdot V.$$

Thereby, the scanning speed V of the reticle 212 becomes as follows. This scanning speed V is used to set the scanning speed of the wafer 215 to β·V.

$$V = L/(n \cdot T).$$

Also, as there is the upper limit $V_{max}$ to the scanning speed V of the reticle 212, the value of the width L of the illumination area 246 on the reticle 212 in the scanning direction is adjusted so as to be $V \leq V_{max}$. For that purpose, the distance between the blades 242A and 242B in FIG. 11 is adjusted. Thereafter, when the image of the pattern of the reticle 212 is exposed on the wafer 215 in the scanning exposure, in the entire exposure area on the wafer 215, the illuminance of the pulsed laser light IL becomes approximately the same level and preferable transferring characteristics can be obtained.

Although intervals (period T) of light emissions are made constant in the above description, the period T may be regulated while the scanning speed V is set to $V_{max}$ and the width L is set to a value corresponding to $V_{max}$. This is performed by the control unit 226 upon receiving instructions from the main control system 225. Also, if the distance (L) between the blades 242A and 242B is fixed, the period T of the light emission and/or the scanning speed V of the reticle 212 may be adjusted from V=L/(n·T) based on the predetermined value n. Namely, at least one of the distance L, the period T and the scanning speed V is adjusted such that n (integer) laser beams are emitted while the exposure area 246P and the wafer 215 are shifted relatively by the width (β·L) of the exposure area 246P in the scanning direction. At this time, it is desirable that the value n equals to a minimum number of pulses (determined in accordance with the variations of the amount of energy of laser beams) necessary for achieving desired uniformity of illuminance on the wafer. This method of determining the required number of pulses is disclosed in, e.g., U.S. Pat. No. 5,097, 291. Also, when the power of the laser beam is changed by changing the period T of the light emission, the power of the laser beam needs to be readjusted by adjusting the angle of the rotating plate 239.

In this embodiment, between the scanning speed V of the reticle 212, the period T of the light emission and the width L of the illumination area 246 on the reticle 212, it is sufficient that the relation V=L/(n·T) is satisfied by the use with the integer n of 1 or more. Accordingly, in a range satisfying this relation, it is possible to set the scanning speed V close to an optimum speed not causing vibrations, to set the period T close to a period capable of preventing unevenness of illuminance maximumly and stabilizing the output, and to set the width L of the illumination area close to an optimum width in consideration of uniformity of distortion, leveling of the wafer 215 and the like. Thereby, while keeping unevenness of illuminance on the wafer 215 minimum, the performance of the exposure apparatus can be enhanced maximumly.

That is, in this embodiment, after setting the value n to the number of pulses for achieving uniformity of illuminance, and when attaching importance to the throughput of the apparatus, the scanning speed V is set to $V_{max}$ and at least one of the period T and the width L should be adjusted. Also, when attaching importance to imaging characteristics (distortion or the like) of the projection optical system, the width L is set to an optimum width capable of obtaining optimum imaging characteristics and at least one of the period T and the scanning speed V should be adjusted.

However, in this embodiment, actually, there is a danger of occurring unevenness of illuminance due to a positional error of the wafer stage 235. Then, if the position of the wafer stage 235 is checked prior to a light emission of the pulsed laser light source 216 and the position of the wafer stage 235 is corrected at the time of the light emission or the timing of the light emission is corrected in accordance with the positional error of the wafer stage 235, the unevenness of illuminance can be reduced much more.

Figure 14:
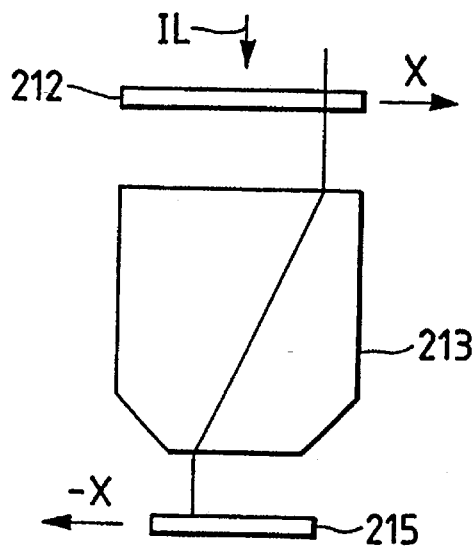
FIG. 14 shows another example of the third embodiment.

Next, another example of the third embodiment will be described with reference to FIGS. 14 and 15. In FIG. 14, the pattern image of the reticle 212 is exposed by the laser beam IL on the wafer 215 via a projection optical system 213 formed of refracting elements only. The pulsed laser light IL illuminates a rectangular area on the reticle 212 and the reticle 212 is scanned in the X direction at the constant speed V. When the magnification of the projection optical system 213 is β, the wafer 215 is scanned in the −X direction at the speed β·V in synchronism with the scanning of the reticle 212.

Figure 15:
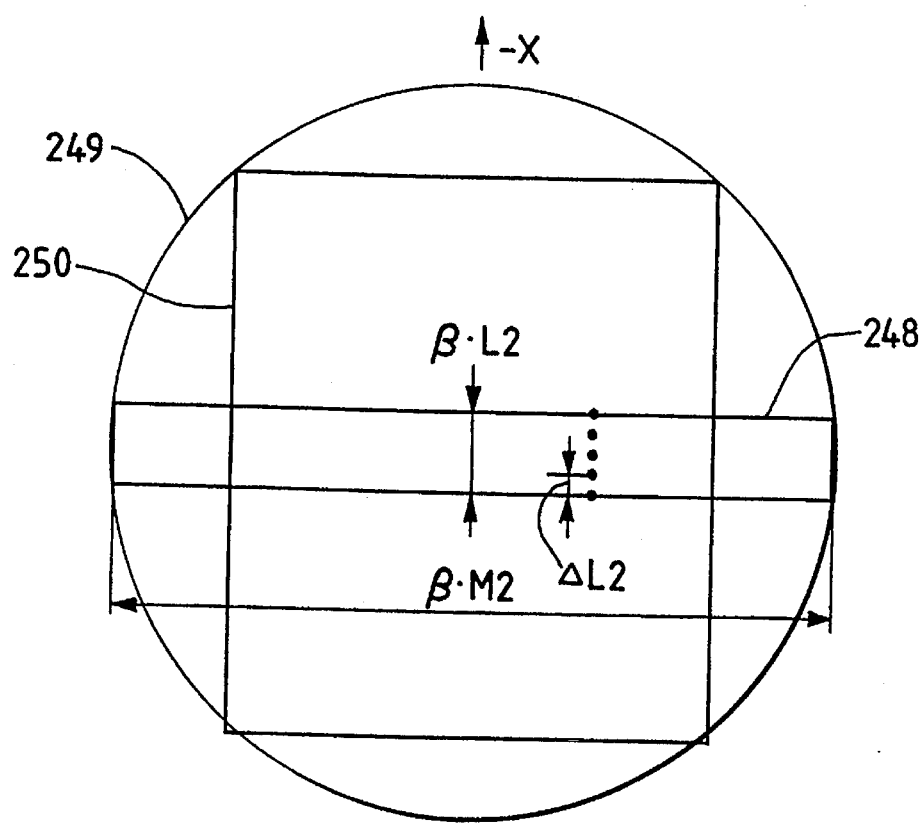
FIG. 15 shows the rectangular projection area of the reticle pattern on the wafer in FIG. 14.

FIG. 15 shows a rectangular exposure area 248 on the wafer 215 of FIG. 14. The pattern of the reticle 212 is projected to the exposure area 248. The width of the exposure area 248 in the scanning direction (X direction) is β·L2 and the width of that in the longitudinal direction is β·M2 (M2>L2). When a circular area 249 is the maximum image field of the projection optical system 213, the width β·M2 of the exposure area 248 in the longitudinal direction is approximately equal to the diameter of the circular area 249. On the other hand, in the stepper, an exposure area 252 on the wafer 215 is approximately a square touching the circular area 249 internally. Therefore, by scanning the wafer 215 in the −X direction with respect to the rectangular area 248, it is possible to expose a larger area as compared to the stepper.

When the period of the emission of the laser beam IL is T, and the distance by which the wafer 215 is scanned in the −X direction for the period T is ΔL2, in this embodiment, the width β·L2 of the exposure area 248 in the −X direction is set as follows by use of an integer n of 1 or more.

$$\beta \cdot L2 = n \cdot \Delta L2.$$

The other structure is the same as in the third embodiment (FIG. 10). Thereby, n laser beams are imparted to each exposure point on the wafer 215. Therefore, in all the exposure points on the wafer 215, the illuminance of the laser beams IL becomes approximately uniform and the unevenness of the illuminance becomes minimum.

What is claimed is:

1. A scanning exposure apparatus comprising:

an illumination system for illuminating a mask with continuous light from a light source;

a first light amount adjusting device which controls power supply to said light source and changes an amount of said continuous light;

a second light amount adjusting device which is disposed in an optical path of said continuous light and whose light reducing ratio with respect to said continuous light is variable;

a projection optical system for projecting an image of a pattern on said mask onto a photosensitive substrate;

a scan system for scanning synchronously said mask and said photosensitive substrate; and a controller which controls said first and second light amount adjusting devices based on a sensitivity characteristic of said photosensitive substrate, a scan speed of said photosensitive substrate and a width of an exposure area in the scan direction of said photosensitive substrate conjugate with an illumination area on the mask with respect to said projection optical system, thereby adjusting the amount of said continuous light.

2. A scanning exposure apparatus comprising:

an illumination system for illuminating a mask with illumination light;

a projection optical system for projecting an image of a pattern on said mask onto a photosensitive substrate;

a scan system for scanning synchronously said mask and said photosensitive substrate; and an adjusting device for changing at least one of a scan speed of said mask and said photosensitive substrate and a width of an exposure area in the scan direction of said photosensitive substrate conjugate with an illumination area on said mask with respect to said projection optical system.

3. An apparatus according to claim 2, wherein said adjusting device includes a field stop for defining an illumination area on said mask and adjusts a width of an opening of the field stop to change the width of said exposure area.

4. An apparatus according to claim 2, wherein said scan system has a mask stage for moving said mask relative to said illumination area and a substrate stage for moving said photosensitive substrate relative to said exposure area; and said adjusting device changes the width of said exposure area so that a moving speed of said mask stage or said substrate stage may be maintained substantially at an upper limit value.

5. A scanning exposure apparatus comprising:

an illumination system for illuminating a mask with illumination light;

a projection optical system for projecting an image of a pattern on said mask onto a photosensitive substrate;

a scan system for scanning synchronously said mask and said photosensitive substrate;

a detection system for detecting an intensity of said illumination light and an adjusting device which changes at least one of a scanning speed of said mask and said photosensitive substrate and a width of an exposure area in a scan direction of said photosensitive substrate conjugate with an illumination area on said mask with respect to said projection optical system.

6. An apparatus according to claim 5, wherein said adjusting device includes a field stop for defining the illumination area on said mask and adjusts a width of an opening of the field stop to change the width of said exposure area.

7. An apparatus according to claim 5, wherein said scan system has a mask stage for moving said mask relative to said illumination area and a substrate stage for moving said photosensitive substrate relative to said exposure area; and said adjusting device changes the width of said exposure area so that a moving speed of said mask stage or said substrate stage may be maintained substantially at an upper limit value.

8. A scanning exposure apparatus comprising:

an illumination system for illuminating a mask with illumination light generated from a light source, after having passed through an opening of a field stop;

a light detector for detecting an intensity of said illumination light;

a scan system for scanning synchronously said mask and said photosensitive substrate; and an adjusting device which adjusts a width of an opening of said field stop based on an output from said light detector, so that a width of an illumination area on said mask in a scan direction of said mask may be changed.

9. A scan exposure apparatus comprising:

an illumination system which illuminates a mask with light from a secondary light source and is able to change an intensity distribution of the secondary light source;

a projection optical system for projecting an image of a pattern on said mask onto a photosensitive substrate;

a scan system for scanning synchronously said mask and said photosensitive substrate; and an adjusting device which, in accordance with change in the intensity distribution of said secondary light source, changes at least one of scan speed of said mask and said photosensitive substrate, an intensity of light incident on said photosensitive substrate and a width of an exposure area in a scan direction of said photosensitive substrate conjugate with an illumination area on said mask with respect to said projection optical system.

10. An apparatus according to claim 9, wherein said illumination system includes a movable member for holding a plurality of stop members for forming said secondary light source, the plurality of stop members being different from each other in shape and size.

11. An apparatus according to claim 9, wherein said adjusting device includes a field stop for defining an illumination area on said mask and adjusts a width of an opening of the field stop to change the width of said exposure area.

12. An apparatus according to claim 9, wherein said scan system has a mask stage for moving said mask relative to said illumination area and a substrate stage for moving said photosensitive substrate relative to said exposure area;

said adjusting device changes a width of said exposure area so that a moving speed of said mask stage or said substrate stage may be maintained substantially at an upper limit value.

13. An apparatus according to claim 9, wherein said adjusting device includes a light source control device for changing a light emission intensity of a light source of said illumination system and changes an intensity of light incident on said photosensitive substrate by adjusting said light emission intensity.

14. A scanning exposure apparatus comprising:
an illumination system for illuminating a mask with illumination light;
a scan system for scanning synchronously said mask and a photosensitive substrate;
a detection system for detecting an amount of deformation of said mask based on an intensity of illumination light passing through said mask; and
a speed adjusting device which adjusts a ratio between a scan speed of said mask and a scan speed of said photosensitive substrate, in accordance with the amount of deformation detected.

15. An apparatus according to claim 14, wherein
said detection system includes a photoconductive detector which receives illumination light passing through said mask and a calculator for calculating the amount of deformation of said mask based on an output from said photoelectric detector.

16. An apparatus according to claim 14, further comprising:
a projection optical system for projecting an image of a pattern on said mask onto said photosensitive substrate; and
an adjusting system for adjusting an imaging state of a pattern image projected by said projection optical system, based on the detected deformation amount.

17. A scanning exposure apparatus comprising:
an illumination system for illuminating a mask;
a scan system for scanning synchronously said mask and a substrate; and
an adjusting device which, in accordance with change in scan speed of said mask or said substrate, changes at least one of an intensity of light incident on said substrate from said mask and a width of the incident light in a scan direction of said substrate.

18. A scanning exposure apparatus comprising:
an illumination system for illuminating a mask;
a scan system for scanning synchronously said mask and a substrate; and
an adjusting device which changes at least one of scan speed of said mask and said substrate and an intensity of light incident on said substrate from said mask, in accordance with change in a width of the incident light in a scan direction of said substrate.

19. A scanning exposure apparatus comprising:
an illumination system for illuminating a mask with light from one of plural stops;
a scan system for scanning synchronously said mask and a substrate; and
an adjusting device which, in accordance with change of said stops, changes at least one of scan speed of said mask and said substrate, an intensity of light incident on said substrate from said mask and a width of the incident light in a scan direction of said substrate.

20. A scanning exposure apparatus comprising:
an illumination system for illuminating a mask with a light beam;
a projection system for projecting an image of a pattern on the illuminated mask onto a photosensitive substrate;
a scan system for scanning synchronously said mask and said photosensitive substrate; and
an adjusting device which adjusts at least one of scan speed $V_W$ of said photosensitive substrate, an intensity $Q$ of said light beam and a width $L_W$ of said light beam in a scan direction on said photosensitive substrate to satisfy the following conditions:

$$P \cdot V_W = L_W \cdot Q, \text{ and}$$

$$L_W \cdot Q/(\beta \cdot P) \leq V_{Rmax} \text{ when } V_{Rmax} < V_{Wmax}/\beta, \text{ and}$$

$$L_W \cdot Q/P \leq V_{Wmax} \text{ when } V_{Rmax} \geq V_{Wmax}/\beta,$$

where $V_{Rmax}$ and $V_{Wmax}$ denote, respectively, a maximum speed of said mask and a maximum speed of said photosensitive substrate, $\beta$ denotes a magnification of said projection system; and
$P$ denotes a sensitivity of said photosensitive substrate.

21. A scanning exposure method comprising:
illuminating a mask with light from a light source of which an intensity distribution is changed;
synchronously scanning said mask and a substrate; and
adjusting at least one of scan speed of said mask and said substrate, an intensity of light incident on said substrate from said mask and a width of the incident light in a scan direction of said substrate, in response to change in said intensity distribution.

22. A scanning exposure method comprising:
providing a characteristic regarding transformation of a mask which is illuminated with light; and
adjusting a ratio between a scan speed of the mask and a scan speed of a substrate illuminated by light from said mask, in accordance with said provided characteristic, to scan synchronously the mask and the substrate.

* * * * *